US012609714B2

(12) United States Patent
Hung

(10) Patent No.: US 12,609,714 B2
(45) Date of Patent: Apr. 21, 2026

(54) ANALOG DIGITAL CONVERSION SENSING BY DYNAMICALLY VARYING CHARGING CAPACITOR VALUES

(71) Applicant: MACRONIX INTERNATIONAL CO., LTD., Hsinchu (TW)

(72) Inventor: Chun-Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 98 days.

(21) Appl. No.: 18/740,805

(22) Filed: Jun. 12, 2024

(65) Prior Publication Data

US 2025/0080131 A1 Mar. 6, 2025

Related U.S. Application Data

(63) Continuation-in-part of application No. 18/380,052, filed on Oct. 13, 2023, and a continuation-in-part of
(Continued)

(51) Int. Cl.
| | |
|---|---|
| *H03M 1/46* | (2006.01) |
| *H03M 1/12* | (2006.01) |
| *H03M 1/40* | (2006.01) |

(52) U.S. Cl.
CPC ........... *H03M 1/466* (2013.01); *H03M 1/121* (2013.01); *H03M 1/1255* (2013.01); *H03M 1/403* (2013.01)

(58) Field of Classification Search
CPC .... H03M 1/466; H03M 1/121; H03M 1/1255; H03M 1/403
(Continued)

(56) References Cited

U.S. PATENT DOCUMENTS 5,913,878 A * 6/1999 Hsung .................. A61N 1/3622
607/5
7,057,939 B2 6/2006 Li et al.
(Continued)

FOREIGN PATENT DOCUMENTS

CN 104051023 A 9/2014
EP 2057633 B1 3/2013
(Continued)

OTHER PUBLICATIONS

U.S. Appl. No. 18/109,455, filed on Feb. 14, 2023, 29 pages.

*Primary Examiner* — Amir Zarabian
*Assistant Examiner* — Daniel John King
(74) *Attorney, Agent, or Firm* — Korbin S Van Dyke; Haynes Beffel & Wolfeld LLP

(57) ABSTRACT

A circuit comprises a plurality of bit lines, a global counter configured to provide a count value, a global reference source, a plurality of capacitors, a comparator, a storage element, and capacitor selector circuitry. The capacitor selector circuitry is configured to select, in dependence on the count value, one or more capacitors from the plurality of capacitors, and wherein the selection of the one or more capacitors is further in dependence on pre-coded codes receivable from an agent separate from the circuit, the pre-coded codes enabling specifying respective first and second sets of the plurality of capacitors as respective one or more capacitors having respective first and second capacitance values, the pre-coded codes further enabling specifying selection of the first set to be performed at an earlier time than selection of the second set, and the second capacitance value is more than the first capacitance value.

20 Claims, 16 Drawing Sheets

Related U.S. Application Data application No. 18/238,908, filed on Aug. 28, 2023, now Pat. No. 12,354,672.

(58) Field of Classification Search
USPC ..................................................... 365/185.01
See application file for complete search history.

(56) References Cited

U.S. PATENT DOCUMENTS

| | | | |
|---|---|---|---|
| 8,891,293 B2 | 11/2014 | Du et al. | |
| 9,099,181 B2 | 8/2015 | Ong | |
| 9,646,692 B1 | 5/2017 | Lung et al. | |
| 10,635,398 B2 | 4/2020 | Lin et al. | |
| 10,741,242 B2 | 8/2020 | Seo et al. | |
| 10,777,566 B2 | 9/2020 | Lue | |
| 10,957,392 B2 | 3/2021 | Lee et al. | |
| 11,132,176 B2 | 9/2021 | Hung et al. | |
| 11,138,497 B2 | 10/2021 | Lin et al. | |
| 11,237,766 B2 * | 2/2022 | Seong | G06F 3/0604 |
| 11,315,009 B2 | 4/2022 | Buchanan et al. | |
| 12,354,672 B2 * | 7/2025 | Hung | G11C 11/5642 |

| | | | |
|---|---|---|---|
| 2003/0090934 A1 | 5/2003 | Iwata | |
| 2008/0031043 A1 | 2/2008 | Aochi et al. | |
| 2019/0019560 A1 * | 1/2019 | Jeong | G11C 11/417 |
| 2019/0287603 A1 | 9/2019 | Antonyan et al. | |
| 2019/0348097 A1 | 11/2019 | Karmakar et al. | |
| 2020/0402582 A1 | 12/2020 | Yang et al. | |
| 2022/0076738 A1 | 3/2022 | Bazarsky et al. | |
| 2022/0295003 A1 * | 9/2022 | Lee | H04N 25/79 |
| 2022/0399062 A1 | 12/2022 | Amarnath et al. | |
| 2023/0207022 A1 | 6/2023 | Lu et al. | |
| 2025/0124988 A1 * | 4/2025 | Hung | G11C 16/28 |

FOREIGN PATENT DOCUMENTS

| | | |
|---|---|---|
| TW | 253057 B | 8/1995 |
| TW | 200620284 A | 6/2006 |
| TW | 200919476 A | 5/2009 |
| TW | 201212026 A | 3/2012 |
| TW | 201301286 A | 1/2013 |
| TW | 1457923 B | 10/2014 |
| TW | 201735037 A | 10/2017 |
| TW | 201933361 A | 8/2019 |
| TW | 1764104 B | 5/2022 |

* cited by examiner

| Icell (nA) | Vref | C (fF) | Time (ns) |
|---|---|---|---|
| 200 | 1.0 | 50 | 250 |
| 400 | 1.0 | 50 | 125 |
| 600 | 1.0 | 50 | 83 |
| 800 | 1.0 | 50 | 63 |

| Charging time t(nS) | Charging Cap. | Vc (I=200nA) | Vc (I=400nA) | Vc (I=600nA) | Vc (I=800nA) | Vref (volt) | Counter Code |
|---|---|---|---|---|---|---|---|
| 0 | 50 | 0.00 | 0.00 | 0.00 | 0.00 | 1 | 1111 |
| 20 | 50 | 0.08 | 0.16 | 0.24 | 0.32 | 1 | 1111 |
| 40 | 50 | 0.16 | 0.32 | 0.48 | 0.64 | 1 | 1110 |
| 60 | 50 | 0.24 | 0.48 | 0.72 | 0.96 | 1 | 1101 |
| 80 | 50 | 0.32 | 0.64 | 0.96 | 1.28 | 1 | 1100 |
| 100 | 50 | 0.40 | 0.80 | 1.20 | 1.60 | 1 | 1011 |
| 120 | 50 | 0.48 | 0.96 | 1.44 | 1.92 | 1 | 1010 |
| 140 | 50 | 0.56 | 1.12 | 1.68 | 2.24 | 1 | 1001 |
| 160 | 50 | 0.64 | 1.28 | 1.92 | 2.56 | 1 | 1000 |
| 180 | 50 | 0.72 | 1.44 | 2.16 | 2.88 | 1 | 0111 |
| 200 | 50 | 0.80 | 1.60 | 2.40 | 3.20 | 1 | 0110 |
| 220 | 50 | 0.88 | 1.76 | 2.64 | 3.30 | 1 | 0101 |
| 240 | 50 | 0.96 | 1.92 | 2.88 | 3.30 | 1 | 0100 |
| 260 | 50 | 1.04 | 2.08 | 3.12 | 3.30 | 1 | 0011 |
| 280 | 50 | 1.12 | 2.24 | 3.30 | 3.30 | 1 | 0010 |
| 300 | 50 | 1.20 | 2.40 | 3.30 | 3.30 | 1 | 0001 |
| 320 | 50 | 1.28 | 2.56 | 3.30 | 3.30 | 1 | 0000 |

FIG. 5D

ANALOG DIGITAL CONVERSION SENSING BY DYNAMICALLY VARYING CHARGING CAPACITOR VALUES

PRIORITY APPLICATION

This application is a continuation-in-part of co-pending U.S. patent application Ser. No. 18/380,052, filed Oct. 13, 2023, titled "MEMORY SENSING WITH GLOBAL COUNTER"; and is also a continuation-in-part U.S. patent application Ser. No. 18/238,908, filed Aug. 28, 2023 (now U.S. Pat. No. 12,354,672), titled "MEMORY SENSING WITH GLOBAL NON-REGULAR COUNTER AND/OR GLOBAL MULTIPLE REFERENCE VOLTAGES", which are hereby incorporated by reference in their entirety for all purposes.

BACKGROUND

Field

The present disclosure relates to local memory sensors (e.g., local sensing circuits of an in-memory compute device) that use a global counter (e.g., a global regular counter or alternatively a global non-regular counter) and/or global multiple reference voltages. More specifically, the present disclosure relates to in-memory computing for performing compute in memory (CIM) operations that implement memory sensors that share a global counter and/or global multiple reference voltages.

Description of Related Art

Conventional in-memory computing components that perform CIM operations implement thousands of individual sensors (e.g., local sensing circuits) to detect analog current and/or voltage on bit lines of a memory array. The local sensing circuits can add or subtract currents that are sensed across pairs of selected bit lines (or a single bit line). For example, the local sensing circuits can add two currents detected on two bit lines and/or can subtract one current from another current, as detected on the two bit lines, to provide an analog output current value. The local sensing circuit can further convert the analog output value to a digital signal that can be used by other portions of the in-memory computing components. For example, each individual local sensing circuit can include (i) a current/voltage manipulator to detect the difference between the currents/voltages (e.g., addition or subtraction of current/voltage values) on the pair of selected bit lines (or a single bit line) to provide an analog current or voltage measurement, (ii) a converter or detector to convert the analog measurement to a digital signal and (iii) storage, such as latches or flip-flops, that can store values, such as counter values, as triggered by an output of the converter/detector and provide a data output.

A problem with the conventional in-memory computing components is that the time it takes for internal circuitry of the local sensing circuit to reach sufficient current or voltage values to trigger the storage of the values (e.g., counter value) varies greatly based on the currents and/or voltages received from the pair of selected bit lines (or a single bit line). As such, lower current and/or voltages can cause the internal circuitry to need more time to reach current and/or voltage values that are necessary to trigger the storage of the values, such as the counter value. Therefore, it is desirable to provide an in-memory compute device or other types of computing devices that can account for varying time intervals necessary for internal circuitry to reach current and/or voltage values necessary to trigger the storage of values, such as the counter value.

SUMMARY

The technology disclosed provides a circuit and a method for sensing currents in bit lines of an array of memory cells.

An aspect of the technology disclosed can include a circuit that includes a plurality of bit lines, a global counter configured to provide a count value, a global voltage reference source, a plurality of capacitors, and capacitor selector circuitry configured to select, in dependence on the count value, one or more capacitors from the plurality of capacitors, the selected one or more capacitors configured (i) to receive a charging current in dependence on a bit line current of a selected bit line of the plurality of bit lines, (ii) to store a charge in dependence on the charging current and (iii) to produce a detected voltage ($V_c$) resulting from the stored charge, and where the selection of the one or more capacitors is further in dependence on pre-coded codes receivable from an agent separate from the circuit, the pre-coded codes enabling specifying respective first and second sets of the plurality of capacitors as respective one or more capacitors having respective first and second capacitance values, the pre-coded codes further enabling specifying selection of the first set of the plurality of capacitors to be performed at an earlier time than selection of the second set of the plurality of capacitors, and the second capacitance value is more than the first capacitance value. The circuit can further include a comparator configured to produce a comparator output in dependence on (i) a voltage provided by the global voltage reference source and (ii) the detected voltage ($V_c$); and a storage element configured (i) to store the count value in dependence on the comparator output and (ii) to produce a stored counter output in dependence on the stored count value.

Further aspects of the technology disclosed can include one or more of the following features. The circuit is included in a first integrated circuit and the agent is included in a second integrated circuit. One or more of voltage conditions and temperature conditions are monitored to determine values of the pre-coded codes. The selected bit line is a first selected bit line; the charging current is in dependence on a second selected bit line of the plurality of bit lines; and the circuit further optionally includes current manipulator circuitry configured to provide the charging current in dependence on the first and the second selected bit lines as a difference between the current of the first selected bit line and a current of the second selected bit line. The circuit optionally includes a memory array that optionally includes the plurality of bit lines. A local sensing circuit optionally includes the plurality of capacitors, the capacitor selector circuitry, the comparator, and the storage element, and where the circuit further optionally includes a plurality of instances of the local sensing circuit, each of the local sensing circuits configured to receive (i) the count value provided by the global counter and (ii) the voltage provided by the global voltage reference source. The global counter optionally includes a global programmable non-regular counter configured to count according to a sequence that optionally includes a sequential series of values; and to receive programmable information specifying one or more durations of the values. The circuit where the voltage provided by the global voltage reference source is one of a plurality of global voltage references; the comparator is further configured to produce the comparator output in dependence on a selected one of the plurality of global voltage references; and the circuit further optionally includes a voltage reference multiplexer configured to provide, in dependence on the count value, the selected one of the plurality of global voltage references. The circuit optionally includes a plurality of current mirrors; and current mirror selector circuitry configured to receive the current of the selected bit line and to select, in dependence on the count value, one or more current mirrors from the plurality of current mirrors to collectively provide the charging current. The comparator output is generated as a result of the detected voltage (V$_c$) reaching, exceeding or falling below the voltage provided by the global voltage reference source. The global counter is one of a regular counter and a non-regular counter.

Another aspect of the technology disclosed can include a circuit that includes a memory array that optionally includes a plurality of bit lines, a global voltage reference source, a plurality of capacitors, and capacitor selector circuitry configured to select, in dependence on a count value, one or more capacitors from the plurality of capacitors, the selected one or more capacitors configured (i) to receive a charging current in dependence on a difference between two bit line currents of a selected two bit lines of the plurality of bit lines, (ii) to store a charge in dependence on the charging current and (iii) to produce a detected voltage (V$_c$) resulting from the stored charge, and where the selection of the one or more capacitors is further in dependence on pre-coded codes receivable from an agent separate from the circuit, the pre-coded codes enabling specifying respective first and second sets of the plurality of capacitors as respective one or more capacitors having respective first and second capacitance values, the pre-coded codes further enabling specifying selection of the first set of the plurality of capacitors to be performed at an earlier time than selection of the second set of the plurality of capacitors, and the second capacitance value is more than the first capacitance value.

Additional aspects of the technology disclosed can include one or more of the following features. The circuit where the capacitor selector circuitry is configured to select the one or more capacitors such that: on a first cycle of a clock, the selected one or more capacitors have a first total capacitance; and on a second cycle of the clock, subsequent to the first cycle of the clock, the selected one or more capacitors have a second total capacitance that is greater than the first total capacitance. The circuit further optionally includes a global counter configured to provide the count value; a comparator configured to produce a comparator output in dependence on (i) a voltage provided by the global voltage reference source and (ii) the detected voltage (V$_c$); and a storage element configured (i) to store the count value in dependence on the comparator output and (ii) to produce a stored counter output in dependence on the stored count value. The circuit where the voltage provided by the global voltage reference source is one of a plurality of global voltage references; the comparator is further configured to produce the comparator output in dependence on a selected one of the plurality of global voltage references; and the circuit further optionally includes a voltage reference multiplexer configured to provide, in dependence on the count value, the selected one of the plurality of global voltage references. The global counter is one of a regular counter and a non-regular counter.

Another aspect of the technology disclosed can include a method including selecting, in dependence on a count value, one or more capacitors from a plurality of capacitors, the selected one or more capacitors (i) receiving a charging current in dependence on a bit line current of a selected bit line of a plurality of bit lines, (ii) storing a charge in dependence on the charging current and (iii) producing a detected voltage (V$_c$) resulting from the stored charge, and where the selection of the one or more capacitors is further in dependence on pre-coded codes received from an agent, the pre-coded codes specifying respective first and second sets of the plurality of capacitors as respective one or more capacitors having respective first and second capacitance values, the pre-coded codes further specifying selection of the first set of the plurality of capacitors to be performed at an earlier time than selection of the second set of the plurality of capacitors, and the second capacitance value is more than the first capacitance value. The method can further include producing a comparator output in dependence on (i) a voltage provided by a global voltage reference source and (ii) the detected voltage (V$_c$), storing the count value in dependence on the comparator output, and producing a stored counter output in dependence on the stored count value.

Aspects of the technology disclosed can further include one or more of the following features. The method optionally includes performing the selecting such that on a first cycle of a clock, the selected one or more capacitors have a first total capacitance; and on a second cycle of the clock, subsequent to the first cycle of the clock, the selected one or more capacitors have a second total capacitance that is greater than the first total capacitance. The method optionally includes providing the pre-coded codes. A memory array optionally includes the plurality of bit lines.

Implementations of the described aspects optionally include hardware, one or more methods or processes, and/or computer software on a computer-accessible medium. Implementations of the described aspects optionally include corresponding computer systems, apparatus, and computer programs recorded on one or more computer storage devices, each configured to perform, e.g., actions of methods.

Other aspects and advantages of the present invention can be seen on review of the drawings, the detailed description and the claims, which follow.

BRIEF DESCRIPTION OF THE DRAWINGS

FIG. 5C is a table illustrating the time it takes for a detected voltage $V_c$ to reach a fixed threshold voltage $V_{ref}$ at a capacitor C at varying current $I_{cell}$ values when implementing the local sensing circuit of FIG. 4 that operates according to a global regular counter, according to embodiments of the present disclosure.

FIG. 5D is a table illustrating a counter code value based on a detected voltage $V_c$ reaching a fixed threshold voltage $V_{ref}$ at a capacitor C (fF) at varying currents $I_{cell}$ values when implementing the local sensing circuit of FIG. 4 that operates according to a global regular counter, according to embodiments of the present disclosure.

DETAILED DESCRIPTION

A detailed description of embodiments of the present invention is provided with reference to the FIGS. 1-14.

Figure 1:
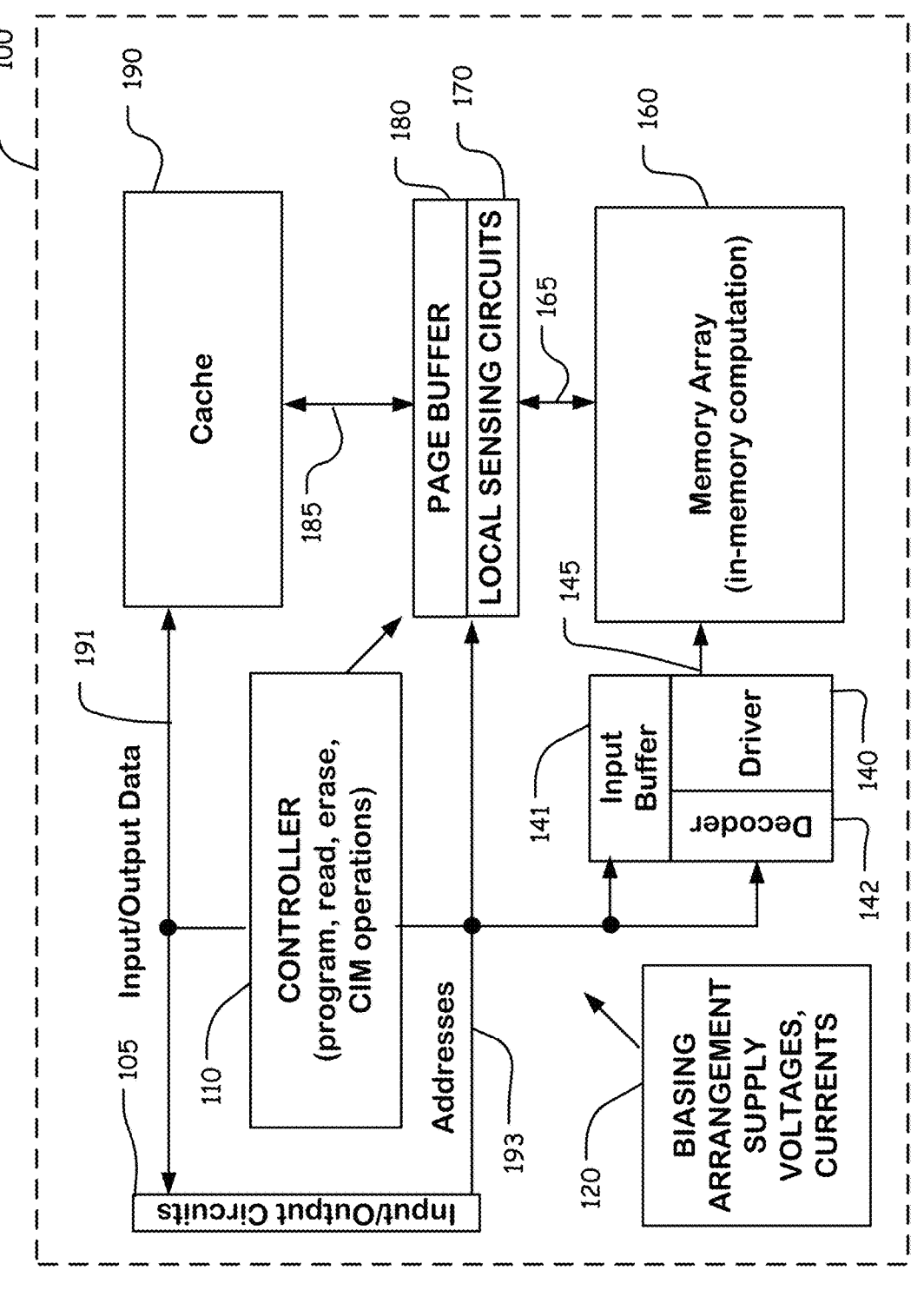
FIG. 1 is a simplified block diagram of an integrated circuit device including a memory array arranged for in-memory computing with, for example, signed inputs and weights, according to embodiments of the present disclosure.

FIG. 1 is a simplified block diagram of an integrated circuit device including a memory array arranged for in-memory computation with, for example, signed inputs and weights, according to embodiments of the present disclosure.

Specifically, FIG. 1 is a simplified block diagram of an integrated circuit device 100 including a memory array 160 arranged for in-memory computation for compute in memory (CIM) operations, such as, for example, a signed, sum-of-products operation. The integrated circuit device 100 can be implemented on a single chip, or on a multichip module.

The integrated circuit device 100 includes input/output circuits 105 for communication of control signals, data, addresses and commands with other data processing resources, such as a central processing unit (CPU) or a memory controller.

Input/output data is applied on bus 191 to a controller 110, and to cache 190. Also, addresses are applied on bus/line 193 to a decoder 142, and to the controller 110. Also, the bus 191 and bus/line 193 can be operably connected to data sources internal to the integrated circuit device 100, such as a general purpose processor or special purpose application circuitry, or a combination of modules providing for example, system-on-a-chip functionality.

The memory array 160 can include an array of memory cells in a NOR architecture or in an AND architecture, such that memory cells are arranged in columns along bit lines and in rows along word lines, and the memory cells in a given column are connected in parallel between a bit line and a source reference. The source reference can comprise a ground terminal or a source line connected to source side biasing resources. The memory cells can comprise charge trapping transistors cells, arranged in a 3D structure.

The bit lines can be connected by block select circuits to global bit lines 165, configured for selectable connection to a page buffer 180, and to local sensing circuits 170 (e.g., CIM sensing circuits).

The page buffer 180 in the illustrated embodiment is connected by bus 185 to the cache 190. The page buffer 180 can include storage elements and further sensing circuits for memory operations, including read and write operations. For flash memory including dielectric charge trapping memory and floating gate charge trapping memory, write operations include program and erase operations.

A word line driver circuit 140 is coupled to word lines 145 in the memory array 160 and applies word line voltages to selected word lines in response to a decoder 142 which decodes addresses on bus/line 193, or in a computation operation, in response to input data stored in input buffer 141.

The controller 110 is coupled to the cache 190 and the memory array 160, and to other peripheral circuits used in memory access and in CIM operations.

Controller 110, using a for example a state machine, controls the application of supply voltages and currents generated or provided through the voltage supply or current sources in block 120, for memory operations and for CIM operations.

The controller 110 includes control and status registers, and control logic which can be implemented using special-purpose logic circuitry including state machines and combinational logic as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

The memory array 160 includes memory cells arranged in columns and rows, where memory cells in columns are connected to corresponding bit lines, and memory cells in rows are connected to corresponding word lines. For CIM operations, the memory array 160 can be programmable to store signed coefficients (weights Wi) in sets of memory cells.

In a CIM mode, the word line driver circuit 140 includes drivers configured to drive signed inputs Xi by a select mode of voltages on selected word lines and unselected word lines from the input buffer 141. The local sensing circuits 170 can be configured to sense differences between first and second currents on respective bit lines in selected bit lines (or selected pairs of bit lines) and to produce outputs for the selected bit lines (or selected pairs of bit lines) as a function of the difference. The sensing of the difference can include subtracting current or voltage values from respective bit lines and can include adding current or voltage values from respective bit lines. The outputs can be applied to storage elements in the page buffer 180 and to the cache 190.

An implementation of a memory array 160 can be based on charge trapping memory cells, such as floating gate memory cells which can include polysilicon charge trapping layers, or dielectric charge trapping memory cells which can include silicon nitride charge trapping layers. Other types of memory technology can be applied in various embodiments of the technology described herein.

Figure 2A:
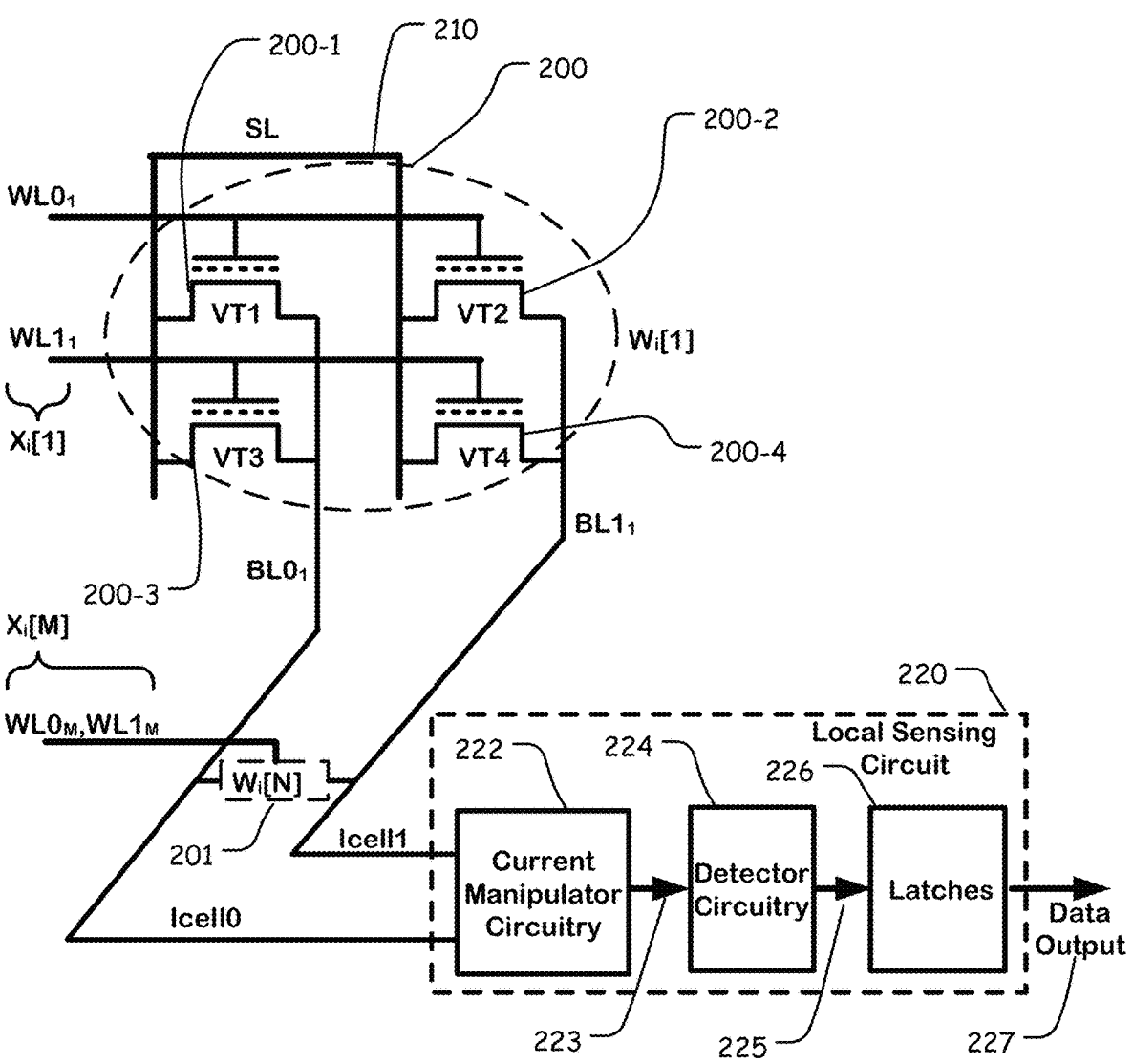
FIG. 2A is a schematic diagram of a set of memory cells and a local sensing circuit arranged for storing and outputting data for in-memory computation, according to embodiments of the present disclosure.

FIG. 2A is a schematic diagram of a set of memory cells and a local sensing circuit arranged for storing and outputting data for in-memory computation, according to embodiments of the present disclosure.

Specifically, FIG. 2A represents a set of memory cells 200, implemented in this example by charge trapping memory transistors, configured to store a bit (e.g., a signed or unsigned bit). The set of memory cells 200 in FIG. 2A can be one of many sets of memory cells used to store many bits in a memory array having a plurality of word lines and a plurality of bit lines. For example, many sets of memory cells 200 like that of FIG. 2A can be used to store a vector of M coefficients $W_1$ (or weights), for i from 1 to M, applied in a sum-of-products operation, or many arrays of coefficients for efficient CIM operations.

The set of memory cells 200 in FIG. 2A includes a first memory cell 200-1, a second memory cell 200-2, a third memory cell 200-3 and a fourth memory cell 200-4. Each of the first, second, third and fourth memory cells 200-1, 200-2, 200-3, 200-4 can be implemented by a charge trapping memory transistor. Other implementations will be apparent to those skilled in the art. For the purposes of notation, the set of memory cells 200 can be referred to as storing a signed bit for a coefficient $W_1$ in a vector Wi. Other implementations for CIM operations will be apparent to those skilled in the art.

The first memory cell 200-1 is on a first bit line $BL0_1$ and a first word line $WL0_1$. The second memory cell 200-2 is on a second bit line $BL1_1$ and the first word line $WL0_1$. The third memory cell 200-3 is on the first bit line $BL0_1$ and a second word line $WL1_1$. The fourth memory cell 200-4 is on the second bit line $BL1_1$ and the second word line $WL1_1$. Source sides (source line or SL sides) of the first, second, third and fourth memory cells 200-1 to 200-4 can be connected to a source reference circuit, which can comprise a ground terminal or a source line (SL) connected to source side biasing resources operable for memory operations such as program and erase. In the illustrated example, the source reference circuit includes a common source line (SL) 210 connected to source side biasing circuits (not shown).

Another set of memory cells 201, is identical in form and structure to that of the set of memory cells 200, but for clarity is illustrated with fewer details. Each of the sets of memory cells 200 and 201 are usable to store a weight value, $W_i[1]$ and $W_i[N]$ respectively. Each of the sets of memory cells 200 and 201 are enabled to receive a respective variable value, $X_i[1]$ and $X_i[M]$ respectively. Each of the variable values is provided by a pair of word lines, $WL0_1$ and $WL1_1$ for $X_i[1]$ and $WL0_M$ and $WL1_M$ for $X_i[M]$. Each of the sets of memory cells 200 and 201 is enabled to perform an arithmetic operation using the stored weight value and the provided variable value, e.g., multiplication ($X_i[1]*W_i[1]$) and to provide results of the operation as currents reflected as portions of Icell0 and Icell1.

Any suitable encoding is usable for encoding a weight value using threshold values (VT1, VT2, VT3, and VT4) respectively on memory cells 200-1, 200-2, 200-3, and 200-4. Any suitable encoding is usable for encoding a variable value using a particular voltage pair on $WL0_1$ and $WL1_1$. Encoding of weight value and variable value is identical for the set of memory cells 201. The set of memory cells 201 is representative of one or more such cells similarly connected in parallel to bit lines $BL0_1$ and $BL1_1$.

Use of VT1, VT2, VT3, and VT4 as well as currents and/or voltages on the first bit line $BL0_1$, the second bit line $BL1_1$, the first word line $WL0_1$ and the second word line $WL1_1$ for performing CIM operations will be apparent to those skilled in the art.

As illustrated in FIG. 2A, the pair of bit lines $BL0_1$ and $BL1_1$ is connected to a local sensing circuit 220. Bit line $BL0_1$ can provide current $I_{cell0}$ to the local sensing circuit 220 and bit line $BL1_1$ can provide current $I_{cell1}$ to the local sensing circuit 220. Further, the currents $I_{cell0}$ and $I_{cell11}$ can be provided and/or detected on a same bit line, such as $BL0_1$ or $BL1_1$. This holds true for all descriptions of providing and/or detecting currents on bit lines described herein.

Further, the local sensing circuit 220 can include current manipulator circuitry 222 that provides an analog output 223 (current or voltage) based on the values of the current $I_{cell0}$ and the current $I_{cell1}$. For example, the current manipulator circuitry 222 can be a circuit that generates a difference in (or an addition of) the current $I_{cell0}$ and the current $I_{cell1}$, as the analog output 223. The local sensing circuit 220 can also include detector circuitry 224 that converts that analog output 223 to a digital output 225 that is stored in a memory, such as latches 226 of the local sensing circuit 220, which can then provide a data output 227.

In-memory compute devices require thousands of local sensing circuits (e.g., local sensing circuits 170 of FIG. 1) and the use of an analog-to-digital converter, such as detector circuitry 224, consumes an undesirable amount of power (e.g., reduces efficiency) and occupies an undesirable amount of physical space, which can reduce an amount of CIM operations that can be carried out in a space of a specific size or that can be carried out given power consumption restrictions.

Figure 2B:
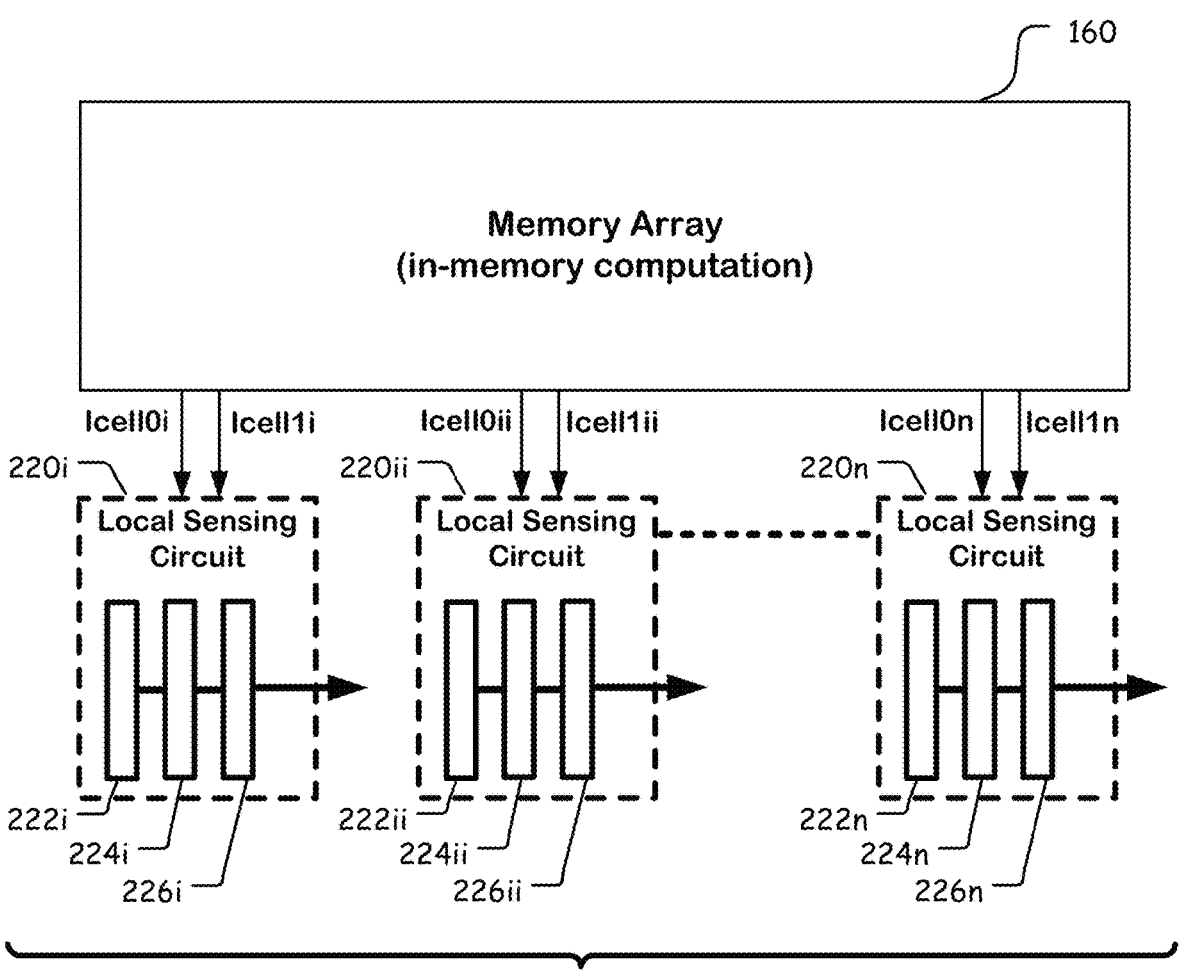
FIG. 2B is a schematic diagram of a memory array used for in-memory computation and thousands of local sensing circuits having local analog-to-digital converters, according to embodiments of the present disclosure.

For example, FIG. 2B is a schematic diagram of the memory array 160 used for in-memory computation and the thousands of local sensing circuits having local analog-to-digital converters, according to embodiments of the present disclosure, that consume an undesirable amount of power and that occupy an undesirable amount of space.

Specifically, FIG. 2B illustrates local sensing circuit 220$i$, local sensing circuit 220$ii$ to local sensing circuit 220$n$, where n can be an integer up to hundreds of thousands or even more. Similar to FIG. 2A, FIG. 2B illustrates that (i) local sensing circuit 220$i$ includes current manipulator circuitry 222$i$, detector circuitry 224$i$ and latches 226$i$ that provide a data output, (ii) local sensing circuit 220$ii$ includes current manipulator circuitry 222$ii$, detector circuitry 224$ii$ and latches 226$ii$ that provide a data output and (iii) local sensing circuit 220$n$ includes current manipulator circuitry 222$n$, detector circuitry and latches 226$n$ that provide a data output. The detector circuitries 224$i$ to 224$n$ can be one of the largest physical components and one of the highest power consuming resources of the local sensing circuits 220$i$ to 220$n$. Accordingly, it is desirable to implement local sensing circuits that do not require individual detector circuitries for the reasons discussed herein.

Figure 3:
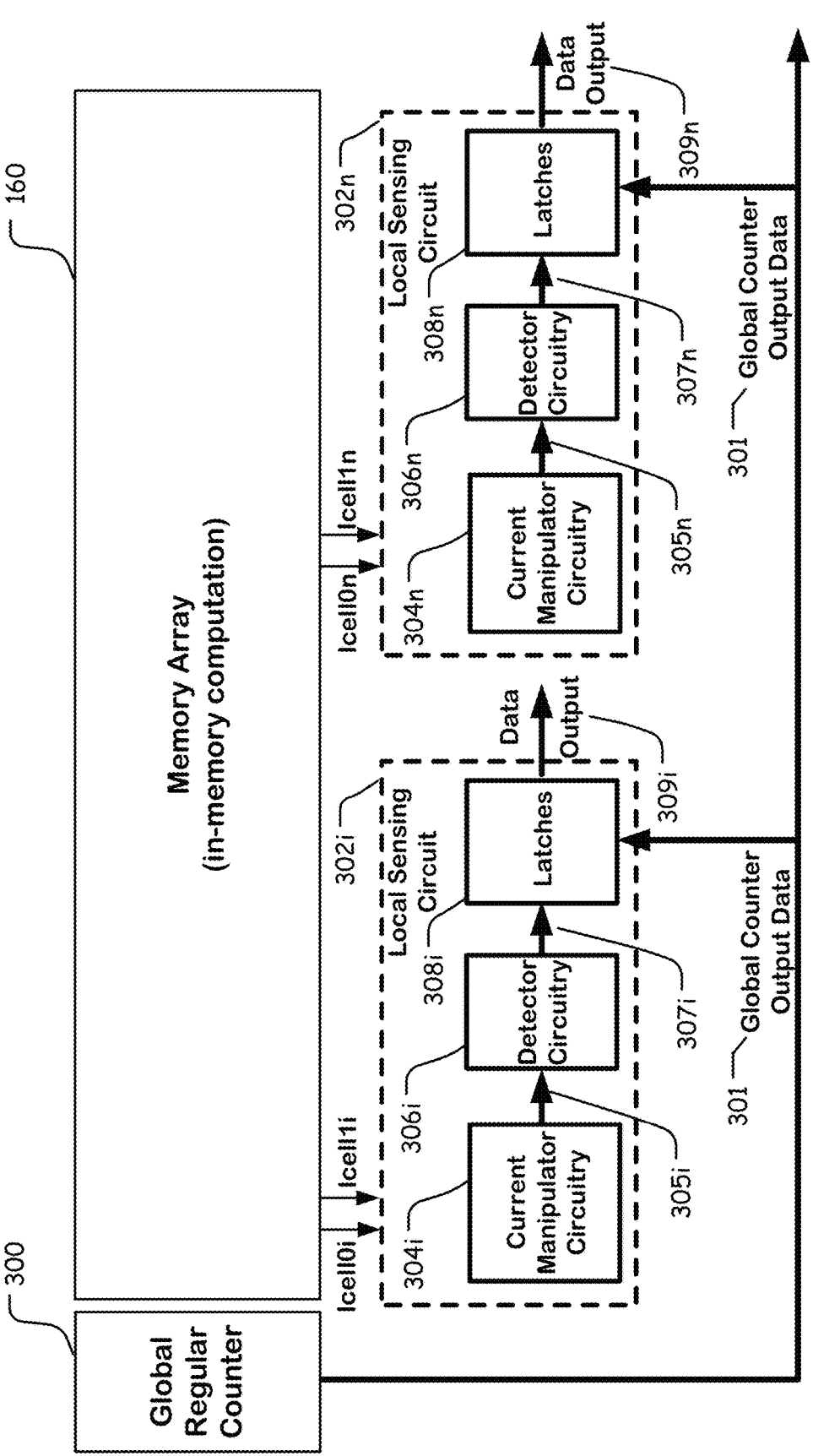
FIG. 3 is a schematic diagram of a memory array used for in-memory computation, local sensing circuits and a global regular counter that is utilized by each of the local sensing circuits, according to embodiments of the present disclosure.

FIG. 3 is a schematic diagram of a memory array used for in-memory computation, local sensing circuits and a global regular counter that is utilized by each of the local sensing circuits, according to embodiments of the present disclosure.

Specifically, as illustrated, a global regular counter 300 provides global counter output data 301, which can be referred to as a count value (such as over time forming a sequential series of count values), to local sensing circuits 302$i$ through 302$n$, where n can be an integer up to hundreds of thousands or even more. Similar to the local sensing circuit 220 of FIG. 2A, the local sensing circuit 302$i$ includes (local) current manipulator circuitry 304$i$ (e.g., a local current manipulator circuit) that provides an output 305$i$, such as an analog output, to (local) detector circuitry 306$i$ (e.g., a local detector circuit). The current manipulator circuitry 304$i$ can operate in the same manner as the current manipulator circuitry 222 of FIG. 2A. For example, the local sensing circuit 302$i$ can receive current $I_{cell0i}$ and current $I_{cell1i}$ from a pair of bit lines (or a single bit line) of the memory array 160 and can sense a difference between the currents $I_{cell0i}$ and $I_{cell1i}$. The difference between the currents $I_{cell0i}$ and $I_{cell1i}$ can be reflected as a subtraction of one current from another current or an addition of one current to another current. The current manipulator circuitry 304$i$ can then provide the output 305$i$ as a function of the sensed or detected difference.

The detector circuitry 306$i$ receives the output 305$i$ and can compare the output 305$i$ to another known value, such as a reference voltage $V_{ref}$. Once the detector circuitry 306$i$ determines that the output 305$i$ has reached, has exceeded and/or has fallen below the other known value, the detector circuitry 306$i$ can provide an output as trigger signal 307$i$ to (local) latches 308$i$ that triggers the storage of the global counter output data 301. Although FIG. 3 illustrates the local sensing circuit 302$i$ as including latches 308$i$, other storage components, such as flip-flops can replace the latches 308$i$ to store the global counter output data 301. The data stored in the latches 308$i$ can be provided as data output 309$i$ resulting from a CIM operation.

As illustrated, there can be n number of local sensing circuits. Specifically, FIG. 3 illustrates local sensing circuit 302$n$ that receives current $I_{cell0n}$ and current $I_{cell1n}$ from a pair of bit lines (or a single bit line) of the memory array 160, wherein the local sensing circuit 302$n$ includes current manipulator circuitry 304$n$ that provides an output 305$n$ to detector circuitry 306$n$ that provides an output 307$n$ to be stored by latches 308$n$ that can provide data output 309$n$ of, for example, a CIM operation.

The global regular counter 300 can continuously provide the global counter output data 301 as a global counter output data 301. As illustrated, the same global counter output data 301 is received by each of the local sensing circuits 302$i$ to 302$n$ (e.g., each of the local sensing circuits 302$i$ to 302$n$ can operate according to the same global regular counter 300 and the global counter output data 301 provided thereby). Specifically, the global counter output data 301 is received by respective latches 308$i$ to 308$n$, which can be triggered to respectively store the global counter output data 301, as triggered by respective trigger signals 307$i$ to 307$n$. The latches 308$i$ to 308$n$ can be any type of component that can store or latch data.

The global regular counter 300 can provide the global counter output data 301 in the form of a binary value, or otherwise. For example, the global counter output data 301 can be a 2-bit, a 3-bit, a 4-bit, a 5-bit, etc. value that is received by the latches 308$i$ to 308$n$. The latches 308$i$ to 308$n$ will have, for example, at least the same number of storage locations as the number of bits of the global counter output data 301 so that the entirety of the global counter output data 301 received from the global regular counter 300 can be stored. As the global regular counter 300 continues to provide the global counter output data 301 to the latches 308$i$ to 308$n$, the global counter output data 301 (e.g., a particular count value) can be stored (latched) at different times by the latches 308$i$ to 308$n$ as they are triggered respectively by the trigger signals 307$i$ to 307$n$ at different times. The global counter output data 301 that is stored by the latches 308$i$ to 308$n$ is then provided at the data output 309$i$ to 309$n$ of the local sensing circuits 302$i$ to 302$n$.

More details regarding the specific structure and operation of the local sensing circuits 302$i$ to 302$n$ is provided below with reference to FIG. 4.

Figure 4:
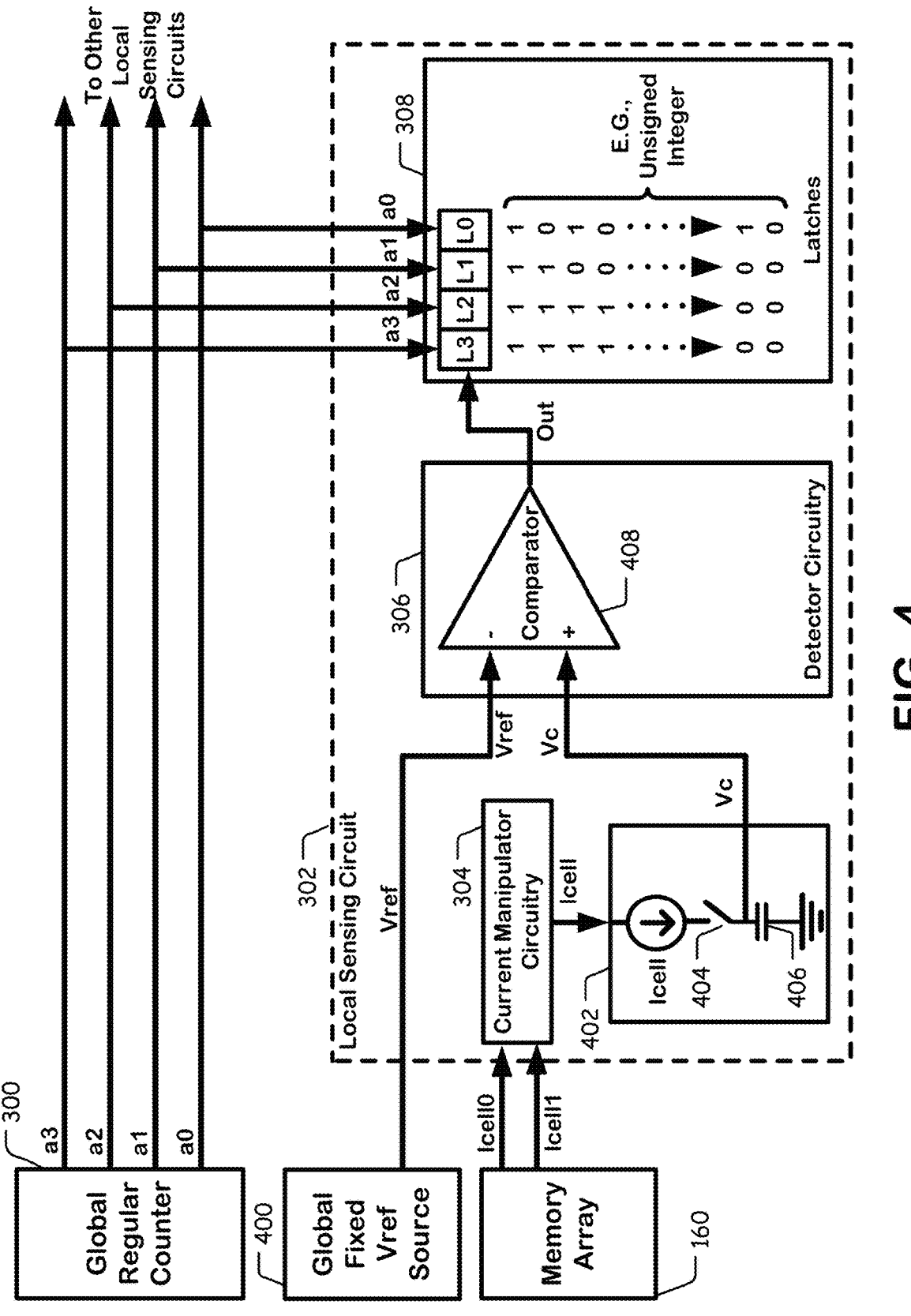
FIG. 4 is a more detailed schematic diagram of a local sensing circuit, a global regular counter and a global fixed V$_{ref}$ source used for in-memory computation, according to embodiments of the present disclosure.

FIG. 4 is a more detailed schematic diagram of a local sensing circuit used for in-memory computation, according to embodiments of the present disclosure. An in-memory compute device can include thousands of local sensing circuits. FIG. 4 illustrates the structure of just one of the local sensing circuits, but all local sensing circuits of the in-memory compute device can have the same structure as discussed here with reference to FIG. 4.

Specifically, FIG. 4 illustrates more details regarding the output of the global regular counter 300 and the circuit structure of the local sensing circuit 302. The global regular counter 300 can output 4 bits as the count value. For example, the global regular counter 300 can output bit a0, bit a1, bit a2 and bit a3 as a four-bit value. The latches 308 of the local sensing circuit 302 can include four latches, including latch L0, latch L1, latch L2 and latch L3. As illustrated, latch L0 can receive the bit value a0, as provided by the global regular counter 300, latch L1 can receive the bit value a1, as provided by the global regular counter 300, latch L2 can receive the bit value a2, as provided by the global regular counter 300 and latch L3 can receive the bit value a3, as provided by the global regular counter 300. The number of bits provided by the global regular counter 300 and the number of latches included in latches 308 is just an example. The technology disclosed herein any utilize any number of bits and latches, wherein the number of latches included in the latches 308 should at least equal the number of bits provided as the global counter output data 301 from the global regular counter 300.

As illustrated in FIG. 4, the binary value represented by bits a0, a1, a2 and a3 increments (counts) between 0 and 15 (e.g., binary value 0000, 0001, 0010, 0011, 0100, 0101, 0110, 0111, 1000, 1001, 1010, 1011, 1100, 1101, 1110 and 1111) as unsigned integers. FIG. 4 illustrates counting from 0 to 15 continuously incrementing by one integer over time. This is just an example, as discussed herein, such that the global regular counter 300 can count forwards and/or backwards in a regular number pattern. The global regular counter 300 can operate based on a clock, such as a high speed clock, or some other mechanism that would be apparent to a person skilled in the art. A value output from the detector circuitry 306 can trigger the latches 308 to store a current global counter output data 301 value provided by the global regular counter 300.

Additionally, as illustrated in FIG. 4, the local sensing circuit 302 includes (local) charge-up circuitry 402 that receives the current $I_{cell}$ as provided by the current manipulator circuitry 304 (as described above with respect to FIGS. 2A and 3). Specifically, the current $I_{cell}$ is received as a current source to the charge-up circuitry 402. The charge-up circuitry 402 can further include an optional switch 404 and the one or more capacitors 406. The switch 404 can be used to allow the one or more capacitors 406 to completely discharge and/or prevent the one or more capacitors 406 from further charging. For example, when the switch 404 switches on (allows current to pass), the current $I_{cell}$ can start to charge the one or more capacitors 406 to accumulate the charge to reach a higher capacitor voltage of $V_c$. For further example, synchronized with the global regular counter 300, the switch 404 is used to discharge the one or more capacitors 406 before counting begins. For another example, the switch 404 is used to enable charging of the one or more capacitors 406 by the current $I_{cell}$, such as in conjunction with making a comparison with the detected voltage $V_c$. For another example, the switch 404 is used to disconnect the current $I_{cell}$ from further charging of the one or more capacitors 406 in conjunction with making a comparison with the detected voltage $V_c$. For another example, the switch 404 is used to discharge any stored charge in the one or more capacitors 406 in preparation for a measurement of the current $I_{cell}$. Then the switch 404 is used to enable the current $I_{cell}$ to charge the one or more capacitors 406 for a particular amount of time, e.g., the switch 404 is closed at the beginning of the particular amount of time and then opened at the end of the particular amount of time. Thus, the detected voltage $V_c$ will attain a value proportional to the current $I_{cell}$, the capacitance value of the one or more capacitors 406, and the particular amount of time. The one or more capacitors 406 can range in values. An example capacitor can be 50 fF. As the one or more capacitors 406 receive the current $I_{cell}$, they begin to charge up and can provide a voltage $V_c$ (e.g., a detected voltage $V_c$) that can be detected by the detector circuitry 306. Over time, as the one or more capacitors 406 charge up from the current $I_{cell}$, the value of the detected voltage $V_c$ will increase.

The in-memory compute device also includes a global fixed $V_{ref}$ source 400 that provides a reference voltage $V_{ref}$ to the detector circuitry 306. The reference voltage $V_{ref}$ can be any voltage available to the in-memory compute device. An example value of the reference voltage $V_{ref}$ is 1.0 volts. The global fixed $V_{ref}$ source 400 can provide the reference voltage $V_{ref}$ to all of the sensing circuits of the in-memory compute device. The detector circuitry 306 can compare the value of the reference voltage $V_{ref}$ to a value of the detected voltage $V_c$. This comparison can be done using a comparator 408. Any other type of circuitry can be implemented to make the comparison between the value of the reference voltage $V_{ref}$ and the value of the detected voltage $V_c$. For example, the comparator 408 can be replaced by one or more differential amplifiers and/or one or more inverters. With the structure of detector circuitry 306 and the comparator 408 illustrated in FIG. 4, the comparator 408 can provide a low output (e.g., 0) when the detected voltage $V_c$ is less than the reference voltage $V_{ref}$ and the comparator 408 can provide a high output (e.g., 1) when the detected voltage $V_c$ is more than the reference voltage $V_{ref}$. Other types of logic can be implemented by the detector circuitry 306, and this illustration is only an example.

In this example, initially while the reference voltage $V_{ref}$ is higher than the detected voltage $V_c$, the comparator 408 will output a value of 0, such that the latches 308 are not triggered to latch (store) the global counter output data 301 (as provided by bits a0 to a3). Over time, as the current $I_{cell}$ charges the one or more capacitors 406, the detected voltage $V_c$ will sufficiently increase such that the detected voltage $V_c$ reaches and/or exceeds the value of the reference voltage $V_{ref}$ and the comparator 408 will output a value of 1 which will trigger the latches 308 to latch (store) the global counter output data 301 (as provided by bits a0 to a3). The output of the detector circuitry 306 and/or the comparator 408 can be referred to as a trigger signal (that triggers the latches 308 to latch/store the global counter output data 301). The trigger signal can change from a value of 0 to 1 or change from a value of 1 to 0 as a result of the detected voltage $V_c$ reaching or exceeding (or dropping/falling below) a value of the reference voltage $V_{ref}$. The detector circuitry 306 can include a multiple comparator configuration. The comparator 408 can be configured to be edge triggered or level triggered or can have other configurations known to those skilled in the art.

Although FIG. 4 illustrates the current manipulator circuitry 304, the charge-up circuitry 402, the detector circuitry 306 and the latches 308 as being local to the local sensing circuit 302, other configurations are possible such that each of the current manipulator circuitry 304, the charge-up circuitry 402, the detector circuitry 306 and the latches 308 is not necessarily local to the local sensing circuit 302. Further, alternatively, a current or voltage generated from the current $I_{cell}$ can be provided to the detector circuitry 306 as the detected voltage $V_c$ (or just as a detected current) without the use of the charge-up circuitry 402 and/or the one or more capacitors 406. For example, the detector circuitry 306 can directly detect the current $I_{cell}$ as provided by the current manipulator circuitry 304 or the detector circuitry 306 can detect the current $I_{cell0}$ and/or $I_{cell1}$ as provided by the memory array 160. Furthermore, rather than providing the reference voltage $V_{ref}$ to the detector circuitry 306, a reference current $I_{ref}$ can be provided to the detector circuitry 306 for comparison to the current $I_{cell}$, the current $I_{cell0}$ and/or the current $I_{cell1}$.

Use of the global regular counter 300 in the in-memory compute device of FIG. 4 can be problematic, as the time that it takes for the one or more capacitors 406 to sufficiently charge up to trigger the storage of the global counter output data 301 can vary greatly in dependence on the value of the current $I_{cell}$ (or a detected voltage). As a result, the latches 308 may need more time to store a global counter output data 301. In other words, the global regular counter 300 may need to be set at a slow count time, so that there is sufficient time for a low value of the current $I_{cell}$ to charge up the one or more capacitors 406 to trigger the storage of a particular global counter output data 301. This is explained in more detail with reference to FIGS. 5A-5D that illustrate operation of the global regular counter 300, the global fixed $V_{ref}$ source 400, and the one or more capacitors 406 operated according to a fixed total capacitance as illustrated in FIG. 4.

Figure 5A:
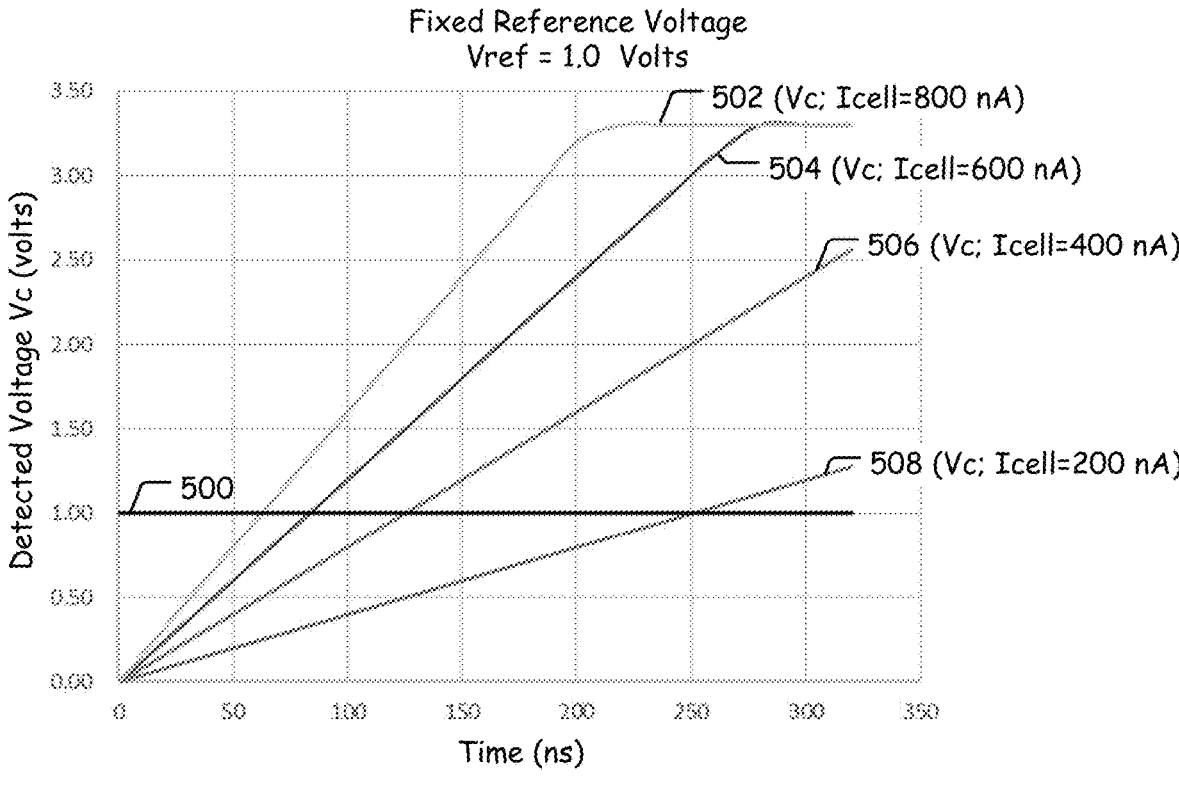
FIG. 5A illustrates a graph of the time it takes for a detected voltage $V_c$ to reach a fixed threshold voltage $V_{ref}$ at different current $I_{cell}$ values when implementing the local sensing circuit of FIG. 4 that operates according to a global regular counter, according to embodiments of the present disclosure.

FIG. 5A illustrates a graph of the time it takes for a detected voltage $V_c$ to reach a fixed threshold voltage $V_{ref}$ at different current $I_{cell}$ values when implementing the local sensing circuit of FIG. 4 that operates according to a global regular counter, according to embodiments of the present disclosure.

Specifically, FIG. 5A illustrates a graph of time in nanoseconds (ns) vs. detected voltage $V_c$ (volts). As discussed above with reference to FIG. 4, the storage of the global counter output data 301 is triggered as a result of the detected voltage $V_c$ reaching or exceeding a value of the fixed reference voltage $V_{ref}$. In this example, the value of the fixed reference voltage $V_{ref}$ is 1.0 volts. Line 500 in the graph of FIG. 5A represents the value of the fixed reference voltage $V_{ref}$. Line 502 is a voltage vs. time representation of the detected voltage $V_c$ when current $I_{cell}$ is 800 nanoamps (nA), line 504 is a voltage vs. time representation of the detected voltage $V_c$ when current $I_{cell}$ is 600 nanoamps (nA), line 506 is a voltage vs. time representation of the detected voltage $V_c$ when current $I_{cell}$ is 400 nanoamps (nA) and line 508 is a voltage vs. time representation of the detected voltage $V_c$ when current $I_{cell}$ is 200 nanoamps (nA). As illustrated, it takes longer for the detected voltage $V_c$ to reach the reference voltage $V_{ref}$ when the current value of the current $I_{cell}$ lower (e.g., 200 nA). Therefore, the global regular counter 300 needs to be configured to count at a rate that allows for the longer time duration (e.g., 250 ns) it takes for the line 508 to reach the fixed reference voltage $V_{ref}$.

Figure 5B:
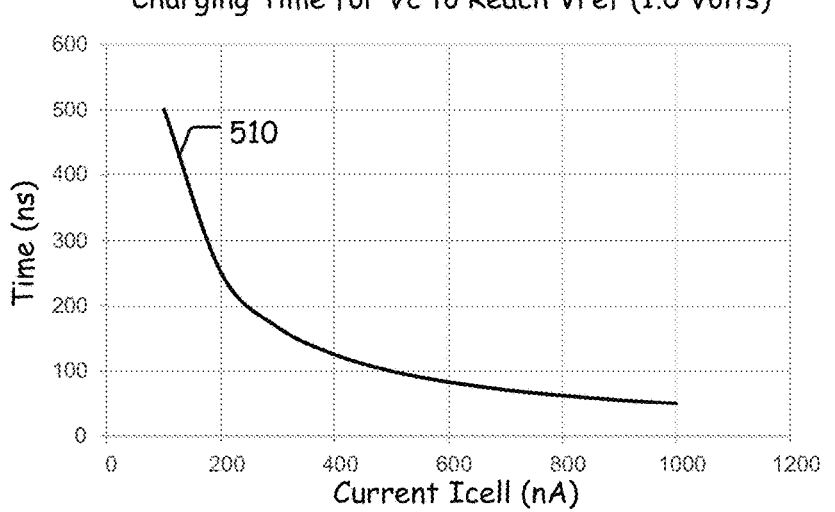
FIG. 5B illustrates a graph of the time it takes for a capacitor to charge up the fixed threshold voltage $V_{ref}$ as current $I_{cell}$ values increase when implementing the local sensing circuit of FIG. 4 that operates according to a global regular counter, according to embodiments of the present disclosure.

FIG. 5B illustrates a graph of the time it takes for a capacitor to charge up the fixed threshold voltage $V_{ref}$ as current $I_{cell}$ values increase when implementing the local sensing circuit of FIG. 4 that operates according to a global regular counter, according to embodiments of the present disclosure.

Specifically, FIG. 5B illustrates a graph of a value of the current $I_{cell}$ measured in nA vs. time measured in ns to represent the charging time that it takes the detected voltage $V_c$ to reach the fixed reference voltage $V_{ref}$ for the different current values represented by lines 502, 504, 506 and 508 in FIG. 5A. Line 510 of FIG. 5B illustrates the charging times for current $I_{cell}$ values of 200 nA, 400 nA, 600 nA, 800 nA and 1000 nA.

FIG. 5C is a table illustrating the time it takes for a detected voltage $V_c$ to reach a fixed threshold voltage $V_{ref}$ at a capacitor C (fF) at varying currents $I_{cell}$ values when implementing the local sensing circuit of FIG. 4 that operates according to a global regular counter, according to embodiments of the present disclosure.

Specifically, FIG. 5C illustrates that (i) it takes 250 ns for detected $V_c$ to reach the fixed reference voltage $V_{ref}$ when charging up a 50 fF capacitor C when current $I_{cell}$ has a value of 200 nA, (ii) it takes 125 ns for detected $V_c$ to reach the fixed reference voltage $V_{ref}$ when charging up a 50 fF capacitor C when current $I_{cell}$ has a value of 400 nA, (iii) it takes 83 ns for detected $V_c$ to reach the fixed reference voltage $V_{ref}$ when charging up a 50 fF capacitor C when current $I_{cell}$ has a value of 600 nA and (iv) it takes 63 ns for detected $V_c$ to reach the fixed reference voltage $V_{ref}$ when charging up a 50 fF capacitor C when current $I_{cell}$ has a value of 800 nA. Further, the difference in time between the current $I_{cell}$ value of 200 and 400 is 125 ns, the difference in time between the current $I_{cell}$ value of 400 and 600 is 42 ns and the difference in time between the current $I_{cell}$ value of 600 and 800 is 20 ns. This varying time interval resulting from the different currents (e.g., 125 ns, 42 ns and 20 ns) can make it difficult to operate the local sensing circuit 302 with regularity.

In order for the global regular counter 300 to operate to account for varying values of the current $I_{cell}$, it is apparent that counter should be configured to accommodate at least 250 ns between increasing or decreasing the count value. This configuration can waste a significant amount of time when the current $I_{cell}$ values is higher (e.g., 800 nA) and much less time is needed between counts of the count value. Furthermore, if count times are not configured to be sufficiently long, then latches can store incorrect count values for lower current $I_{cell}$ values (e.g., 200 nA). Therefore, it is desirable to implement a global counter that is not regular, but is non-regular (e.g., dynamic), such that longer count times are provided for lower current $I_{cell}$ values and shorter count times are provided for higher current $I_{cell}$ values.

FIG. 5D is a table illustrating a counter code value based on a detected voltage $V_c$ reaching a fixed threshold voltage $V_{ref}$ at a capacitance C (fF) at varying current $I_{cell}$ values when implementing the local sensing circuit of FIG. 4 that operates according to a global regular counter, according to embodiments of the present disclosure.

Specifically, FIG. 5D illustrates that the global regular counter 300 outputs a value latched by the latches 308 as (i) 0011 when charging up a 50 fF capacitor C when current $I_{cell}$ has a value of 200 nA, (ii) 1001 when charging up a 50 fF capacitor C when current $I_{cell}$ has a value of 400 nA, (iii) 1011 when charging up a 50 fF capacitor C when current $I_{cell}$ has a value of 600 nA and (iv) 1100 when charging up a 50 fF capacitor C when current $I_{cell}$ has a value of 800 nA.

Other entries in the table correspond to either the detected voltage $V_c$ being lower than the fixed reference voltage $V_{ref}$ (too low to yet trigger latching by the latches 308) or having already become higher than the fixed reference voltage $V_{ref}$ (and thus having already triggered the latching by the latches 308). As a first example of the detected voltage $V_c$ being lower than the fixed reference voltage $V_{ref}$, consider the entirety of the rows for times from 0 ns through 60 ns. For all the current $I_{cell}$ values (200 nA, 400 nA, 600 nA and 800 nA), the detected voltage $V_c$ is lower than the fixed reference voltage $V_{ref}$. As a second example of the detected voltage $V_c$ being lower than the fixed reference voltage $V_{ref}$, consider the entries for times from 0 ns through 240 ns for the current $I_{cell}$ value of 200 nA. For those entries, the detected voltage $V_c$ is lower than the fixed reference voltage $V_{ref}$. As a first example of the detected voltage $V_c$ already being higher than the fixed reference voltage $V_{ref}$, consider the entirety of the rows for times from 280 ns through 320 ns. For all the current $I_{cell}$ values (200 nA, 400 nA, 600 nA and 800 nA), the detected voltage $V_c$ is already higher than the fixed reference voltage $V_{ref}$ (and thus the latching has already occurred). As a second example of the detected voltage $V_c$ already being higher than the fixed reference voltage $V_{ref}$, consider the times from 100 ns through 320 ns for the current $I_{cell}$ value of 800 nA. For those entries, the detected voltage $V_c$ is already higher than the fixed reference voltage $V_{ref}$ (and thus the latching has already occurred).

Figure 6:
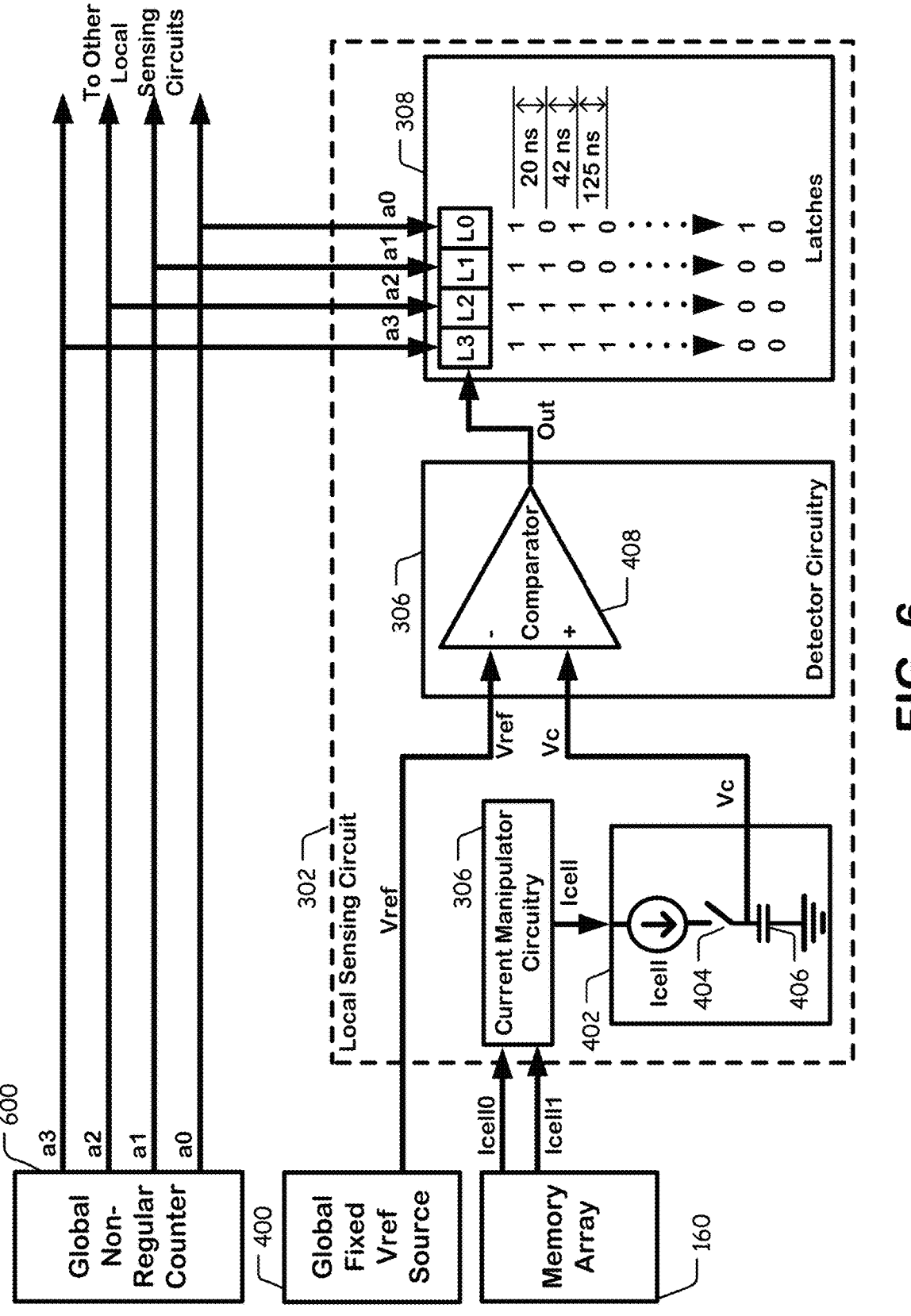
FIG. 6 is a schematic diagram of a local sensing circuit and a global non-regular counter used for in-memory computation, according to embodiments of the present disclosure.

FIG. 6 is a schematic diagram of a local sensing circuit and a global non-regular counter used for in-memory computation, according to embodiments of the present disclosure.

FIG. 6 is similar to FIG. 4, except that the global regular counter 300 of FIG. 4 has been replaced with a global non-regular counter 600. The global non-regular counter 600 can have the ability to adjust the duration (e.g., time interval) between sending count values. The global non-regular counter 600 can be a non-regular counter that increments or decrements count values at non-regular intervals, a bit number counter (e.g., a bit counter) that counts a number of received bits and increments or decrements count values accordingly over time, etc. Other types of non-regular counters that provide data in a dynamic time interval that can be based on the measured current $I_{cell}$ and based on other factors that will be apparent to those skilled in the art.

As illustrated in FIG. 6, the global non-regular counter 600 can (i) wait 125 ns from when a count value of 1100 is provided and when a count value of 1101 is provided, (ii) wait 42 ns from when the count value of 1101 is provided and when a count value of 1110 is provided and (iii) wait 20 ns from when the count value of 1110 is provided and when a count value of 1111 is provided. This timing scheme is only an example. The timing interval implemented by the global non-regular counter 600 can be based on measured values of the current $I_{cell}$, such that if the current $I_{cell}$ increases in value the time between counts provided by the global non-regular counter 600 decreases and such that if the current $I_{cell}$ decreases in value the time between counts provided by the global non-regular counter 600 increases. The current $I_{cell}$ can be defined and known at the time various cells are programmed, so that the time interval of the global non-regular counter 600 can be adjusted and programmed accordingly as the current $I_{cell}$ can be known/anticipated at the time of reading data from various cells. This timing scheme of the global non-regular counter 600 is just an example based on known $I_{cell}$ values and known reference voltage $V_{ref}$ values.

While the implementation of the global non-regular counter 600 can solve the problem of correcting the issues with waiting a sufficient amount of time between changing a count value so that the latches 308 can latch a correct count value in view of varying current $I_{cell}$ values, a result can be that performance of the in-memory compute device is longer than desired. Specifically, even if the shortest time interval is 20 ns for higher current $I_{cell}$ values of 800 nA, other timing intervals are longer (e.g., 125 ns). As a result, the total counting time of the global non-regular counter 600 can be longer than desired. Therefore, there is a desire to provide an in-memory compute device that can further reduce the total counting time for the global non-regular counter 600 to cycle through count values.

Figure 7:
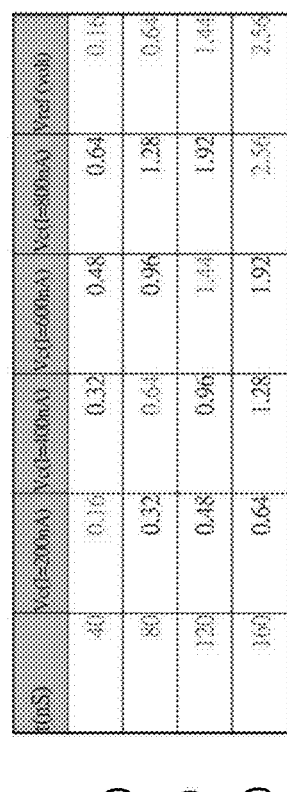
FIG. 7 illustrates aspects of dynamically adjusting reference voltages $V_{ref}$, the illustration including a graph and a table, where the graph identifies a time it takes for a detected voltage $V_c$ to reach a dynamically adjusted reference voltage $V_{ref}$ using varying current $I_{cell}$ values when implementing the local sensing circuit, according to embodiments of the present disclosure.
Figure 7:
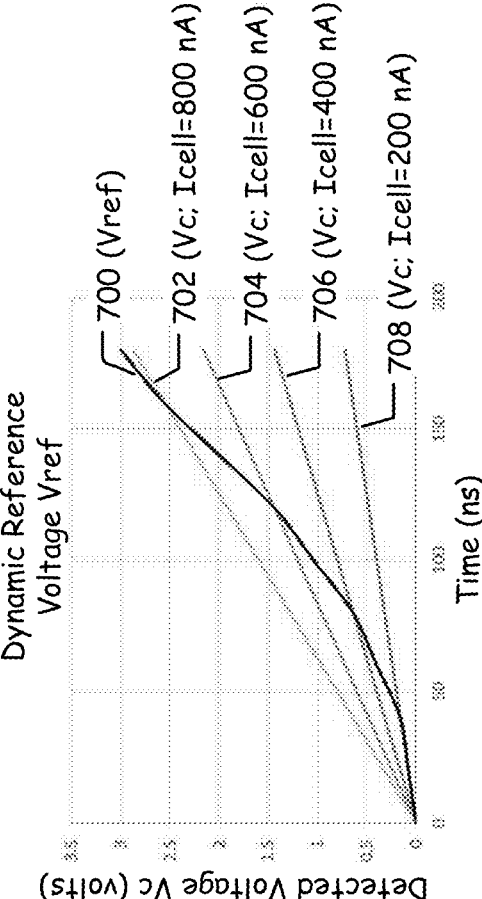

FIG. 7 illustrates aspects of dynamically adjusting reference voltages $V_{ref}$, the illustration including a graph and a table, where the graph identifies a time it takes for a detected voltage $V_c$ to reach example dynamically adjusted reference voltages $V_{ref}$ using varying current $I_{cell}$ values when implementing the local sensing circuit, according to embodiments of the present disclosure.

Specifically, the graph of FIG. 7 illustrates a graph of time in nanoseconds (ns) vs. detected voltage $V_c$ (volts). The storage of the global counter output data 301 is triggered as a result of the detected voltage $V_c$ reaching or exceeding a value of the reference voltage $V_{ref}$. In this example, the value of the reference voltage $V_{ref}$ is dynamic, as it changes over time. Line 700 in the graph of FIG. 7 represents the value of the dynamic reference voltage $V_{ref}$ as it could change over time. Line 702 is a voltage vs. time representation of the detected voltage $V_c$ when current $I_{cell}$ is 800 nanoamps (nA). As illustrated, line 702 crosses line 700 at about time 160 ns. Line 704 is a voltage vs. time representation of the detected voltage $V_c$ when current $I_{cell}$ is 600 nanoamps (nA). As illustrated, line 704 crosses line 700 at about 120 ns. Line 706 is a voltage vs. time representation of the detected voltage $V_c$ when current $I_{cell}$ is 400 nanoamps (nA). As illustrated, line 706 crosses line 700 at about 80 ns. Line 708 is a voltage vs. time representation of the detected voltage $V_c$ when current $I_{cell}$ is 200 nanoamps (nA). As illustrated, line 708 crosses line 700 at about 40 ns.

Therefore, as represented by the graph of FIG. 7, dynamically adjusting the value of the reference voltage $V_{ref}$ can allow for a more consistent interval of the detected voltage $V_c$ reaching the dynamic reference voltage $V_{ref}$ for different values of the current $I_{cell}$. In this illustration, the interval is about 40 ns. As illustrated, it takes longer for the detected voltage $V_c$ to reach the reference voltage $V_{ref}$ when the current $I_{cell}$ is lower (e.g., 200 nA).

The table in FIG. 7 illustrates (i) the various times in ns, (ii) the values of the detected voltage $V_c$ at different current values of $I_{cell}$ (200 nA, 400 nA, 600 nA and 800 nA) at the corresponding times in ns and (iii) the value of the dynamically adjusted reference voltage $V_{ref}$ at corresponding times in ns. As illustrated: (i) at 40 ns, the detected voltage $V_c$ of 0.16 volts (for a current $I_{cell}$ value of 200 nA) matches the value of 0.16 volts of the dynamically adjusted reference voltage $V_{ref}$, (ii) at 80 ns, the detected voltage $V_c$ of 0.64 volts (for a current $I_{cell}$ value of 400 nA) matches the value of 0.64 volts of the dynamically adjusted reference voltage $V_{ref}$, (iii) at 120 ns, the detected voltage $V_c$ of 1.44 volts (for a current $I_{cell}$ value of 600 nA) matches the value of 1.44 volts of the dynamically adjusted reference voltage $V_{ref}$, and (iv) at 160 ns, the detected voltage $V_c$ of 2.56 volts (for a current $I_{cell}$ value of 800 nA) matches the value of 2.56 volts of the dynamically adjusted reference voltage $V_{ref}$. Accordingly, the intervals of the detected voltage $V_c$ at different cell current values can be kept the same by using a dynamic reference voltage $V_{ref}$. This consistency between the intervals (e.g., the same timing resolution between neighboring current levels) provides a benefit in that sensing windows (of time) are even for all neighbor current levels and optimized.

This dynamically adjusted reference voltage $V_{ref}$ could be implemented using a global dynamic $V_{ref}$ source, in a similar manner as the global non-regular counter 600.

Figure 8:
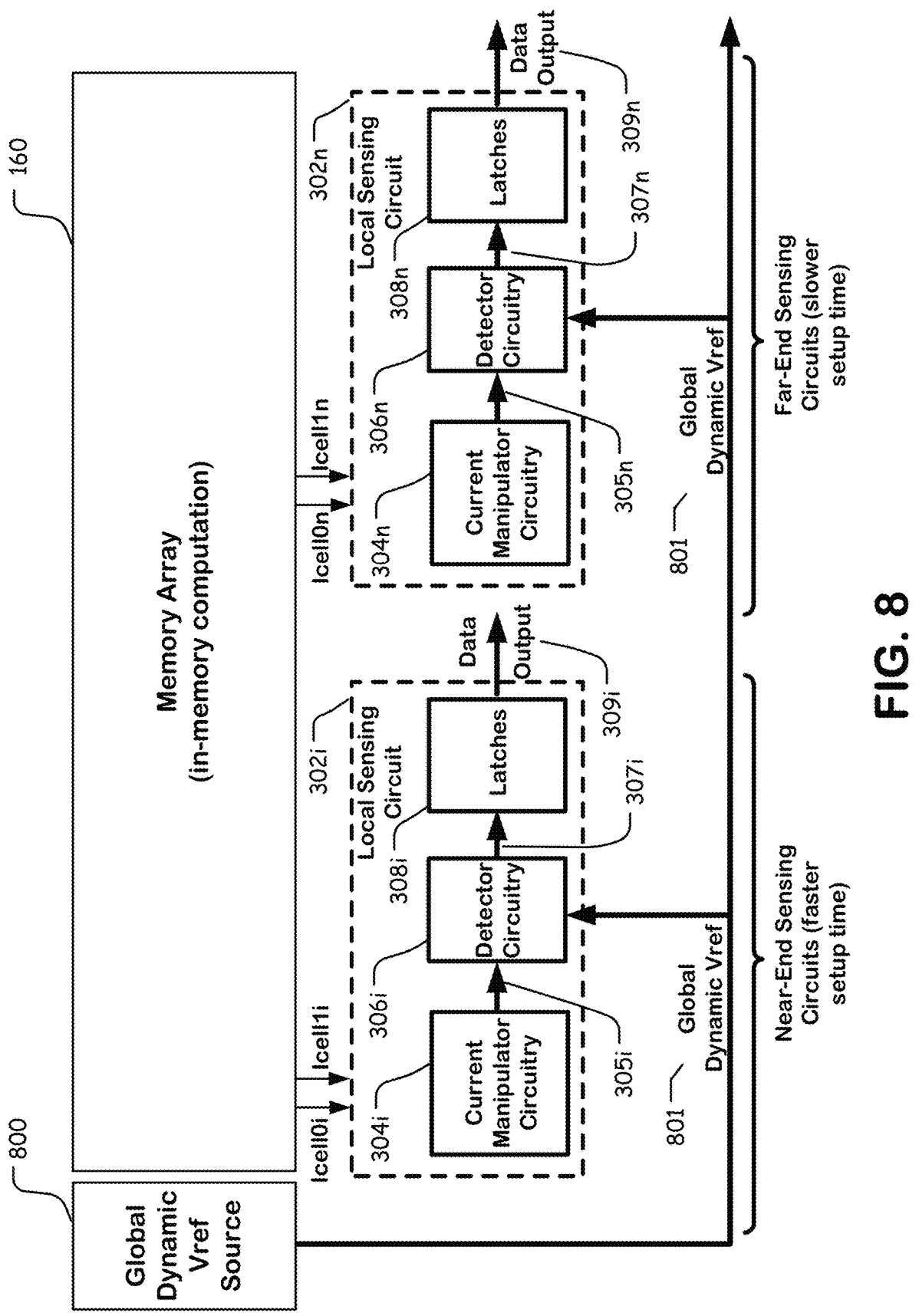
FIG. 8 is a schematic diagram of a memory array used for in-memory computation, local sensing circuits and including a global dynamic $V_{ref}$ source, according to embodiments of the present disclosure.

FIG. 8 is a schematic diagram of a memory array used for in-memory computation, local sensing circuits and including a global dynamic $V_{ref}$ source, according to embodiments of the present disclosure.

FIG. 8 is similar to FIG. 3, except that FIG. 8 includes a global dynamic $V_{ref}$ source 800 to provide the dynamically adjusted reference voltage $V_{ref}$ as discussed with reference to FIG. 7. As illustrated, the global dynamic $V_{ref}$ source 800 can provide the (global) dynamically adjusted reference voltage $V_{ref}$ 801 to each of the local sensing circuits 302i to 302n. Further, as illustrated, the local sensing circuit 302i is closer to the global dynamic $V_{ref}$ source 800 than the local sensing circuit 302n. The local sensing circuits that are closer to the global dynamic $V_{ref}$ source 800 can be referred to as "near-end sensing circuits", which have a faster setup time and the local sensing circuits that are further from the global dynamic $V_{ref}$ source 800 can be referred to as "far-end sensing circuits," which have a longer setup time. Setup time refers to the time it takes for the value of the dynamically adjusted reference voltage $V_{ref}$ to reach the respective detector circuitry 306i to 306n. The difference between a faster setup time and a longer setup time can be 10 ns, which is a valuable amount of time in fast memory devices. The differences in setup times between the "near-end sensing circuits" and the "far-end sensing circuits" can result in different dynamic reference voltage $V_{ref}$ being received by detector circuitry 306i to 306n at any given time. As a result, at any given time the dynamic reference voltage $V_{ref}$ being utilized by detector circuitry 306*i* can be different than the dynamic reference voltage $V_{ref}$ being utilized by detector circuitry 306*n*. These setup time differences can be accounted for, as discussed below.

Figure 9:
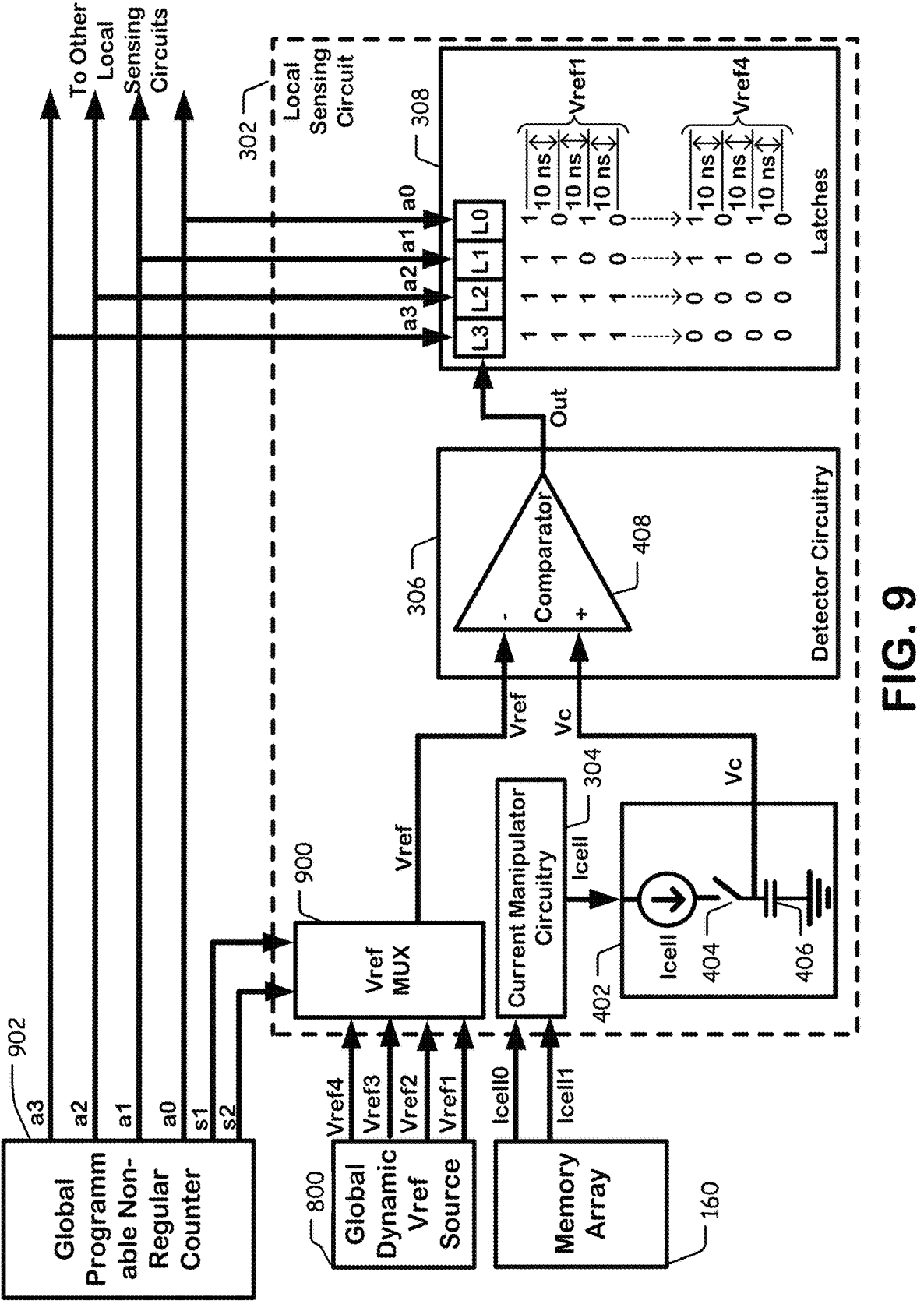
FIG. 9 is a schematic diagram of the local sensing circuit and the global dynamic $V_{ref}$ source that addresses the setup time differences discussed with reference to FIG. 8, and further including a reference voltage $V_{ref}$ multiplexer in the local sensing circuit and including a global programmable non-regular counter, according to embodiments of the present disclosure.

FIG. 9 is a schematic diagram of the local sensing circuit and the global dynamic $V_{ref}$ source that addresses the setup time differences discussed with reference to FIG. 8, and further including a reference voltage $V_{ref}$ multiplexer in the local sensing circuit and including a global programmable non-regular counter, according to embodiments of the present disclosure.

Specifically, FIG. 9 illustrates components of an in-memory compute device in a similar manner as FIG. 6, except that FIG. 9 further includes the global dynamic $V_{ref}$ source 800 of FIG. 8, a global programmable non-regular counter 902 and a reference voltage $V_{ref}$ multiplexer 900. Redundant descriptions of components are omitted. As illustrated in FIG. 9, the global dynamic $V_{ref}$ source 800 provides four reference voltages to the reference voltage $V_{ref}$ multiplexer 900. The global dynamic $V_{ref}$ source 800 can provide just one reference voltage or multiple reference voltages. The first reference voltage is $V_{ref1}$, the second reference voltage is $V_{ref2}$, the third reference voltage is $V_{ref3}$ and the fourth reference voltage is $V_{ref4}$. The first reference voltage $V_{ref1}$ can be used for different $I_{cell}$ values (e.g., four different $I_{cell}$ values), the second reference voltage $V_{ref2}$ can be used for different $I_{cell}$ values (e.g., four different $I_{cell}$ values), the third reference voltage $V_{ref3}$ can be used for different $I_{cell}$ values (e.g., four different $I_{cell}$ values), and the fourth reference voltage $V_{ref4}$ can be used for different $I_{cell}$ values (e.g., four different $I_{cell}$ values).

The global dynamic $V_{ref}$ source is not limited to providing only four reference voltages and it can provide more than four or fewer than four (e.g., just one). The reference voltage $V_{ref}$ multiplexer 900 is configured to select between outputting any one of the reference voltages received from the global dynamic $V_{ref}$ source 800 according to one or more received signals.

In this example, the global programmable non-regular counter 902 provides the same or similar counting functionality as the global non-regular counter 600 of FIG. 6 and further provides the one or more switching signals to the reference voltage $V_{ref}$ multiplexer 900. The global programmable non-regular counter 902 can be a non-regular counter that increments or decrements count values at non-regular intervals, a bit number counter (e.g., a bit counter) that counts a number of received bits and increments or decrements count values accordingly over time, etc. Other types of non-regular counters that provide data in a dynamic time interval will be apparent to those skilled in the art.

Specifically, in this example the global programmable non-regular counter 902 provides switching signals including a first switching signal s1 and a second switching signal s2 to the reference voltage $V_{ref}$ multiplexer 900 according to which the reference voltage $V_{ref}$ multiplexer 900 selects a single reference voltage $V_{ref}$. The number of switching signals provided from the global programmable non-regular counter 902 to the reference voltage $V_{ref}$ multiplexer 900 can be dependent upon the number of reference voltages received by the reference voltage $V_{ref}$ multiplexer 900. The first switching signal s1 and the second switching signal s2 can provide a binary number representing numerical values from 0 to 3, which can be used by the reference voltage $V_{ref}$ multiplexer 900 to select any one of the first reference voltage $V_{ref1}$, the second reference voltage $V_{ref2}$, the third reference voltage $V_{ref3}$ and the fourth reference voltage $V_{ref4}$.

This structure illustrated in FIG. 9 addresses the setup time differences discussed above with reference to FIG. 8, because each of the first reference voltage $V_{ref1}$, the second reference voltage $V_{ref2}$, the third reference voltage $V_{ref3}$ and the fourth reference voltage $V_{ref4}$ can be constant values, which can be transmitted as the reference voltage $V_{ref}$ to the detector circuitry 306, as well as the detector circuitry 306*i* to 306*n*. Specifically, use of the first and second switching signals s1 and s2 and the reference voltage $V_{ref}$ multiplexer 900 can reduce the setup time difference between the "near-end sensing circuits" and the "far-end sensing circuits."

The global programmable non-regular counter 902 can be programmed to cause the reference voltage $V_{ref}$ multiplexer 900 to select different reference voltages received by the global dynamic $V_{ref}$ source 800 according to various timing schemes. For example, as illustrated in the binary count in the latches 308 of FIG. 9, a different one of the first through fourth reference voltages can be implemented for a certain number of count values. In this example, the fourth reference voltage $V_{ref4}$ can be selected for count values from 0 to 3, the third reference voltage $V_{ref3}$ can be selected for count values from 4-7, the second reference voltage $V_{ref2}$ can be selected for count values from 8-11 and the first reference voltage $V_{ref1}$ can be selected for count values from 12-15. The timing scheme can be determined by dividing the total number of count values (e.g., 16 count values due to the counter value being represented by a 4 bits) by the number of reference voltages provided by the global dynamic $V_{ref}$ source 800. The switching of the reference voltage $V_{ref}$ multiplexer 900 can be controlled to track the charge-up time intervals required for the detected voltage $V_c$ to reach the various reference voltages $V_{ref1}$, $V_{ref2}$, $V_{ref3}$, $V_{ref4}$ which can be used to reduce the variation of the time intervals implemented by the global programmable non-regular counter 902.

The global programmable non-regular counter 902 can be configured to adjust the duration between each count value. For example, as illustrated in FIG. 9, durations of 10 ns, 10 ns, 10 ns, etc. can be implemented. Alternatively, non-equal intervals can be implemented, such as 30 ns, 20 ns, 10 ns, etc. Other timing schemes will be apparent to those skilled in the art. Accordingly, by using the global programmable non-regular counter 902 to control the switching of the reference voltage $V_{ref}$ multiplexer 900 by way of the switching signals s1 and s2, it is possible for the selection of the reference voltage signals by the reference voltage $V_{ref}$ multiplexer 900 to track the time intervals of different values of current $I_{cell}$ causing the detected voltage $V_c$ to reach the various selected reference voltage signals. In other words, the global programmable non-regular counter 902 can toggle or change the binary data outputs (a0-a3, s1 and s2) according to time intervals tracking the time of different current $I_{cell}$ values causing the detected voltage $V_c$ to reach different reference voltages $V_{ref1}$, $V_{ref2}$, $V_{ref3}$, $V_{ref4}$, so that the variation of the time interval implemented by the global programmable non-regular counter 902 can be reduced compared to implementations with only one reference voltage $V_{ref}$ available. This time interval tracking can be used to match the charge-up time of the one or more capacitors 406 to reach the selected reference voltage $V_{ref}$.

In some implementations in accordance with FIG. 9, the global programmable non-regular counter 902 is replaced by a global programmable regular counter, such as the global non-regular counter 600 of FIG. 6.

Figure 10:
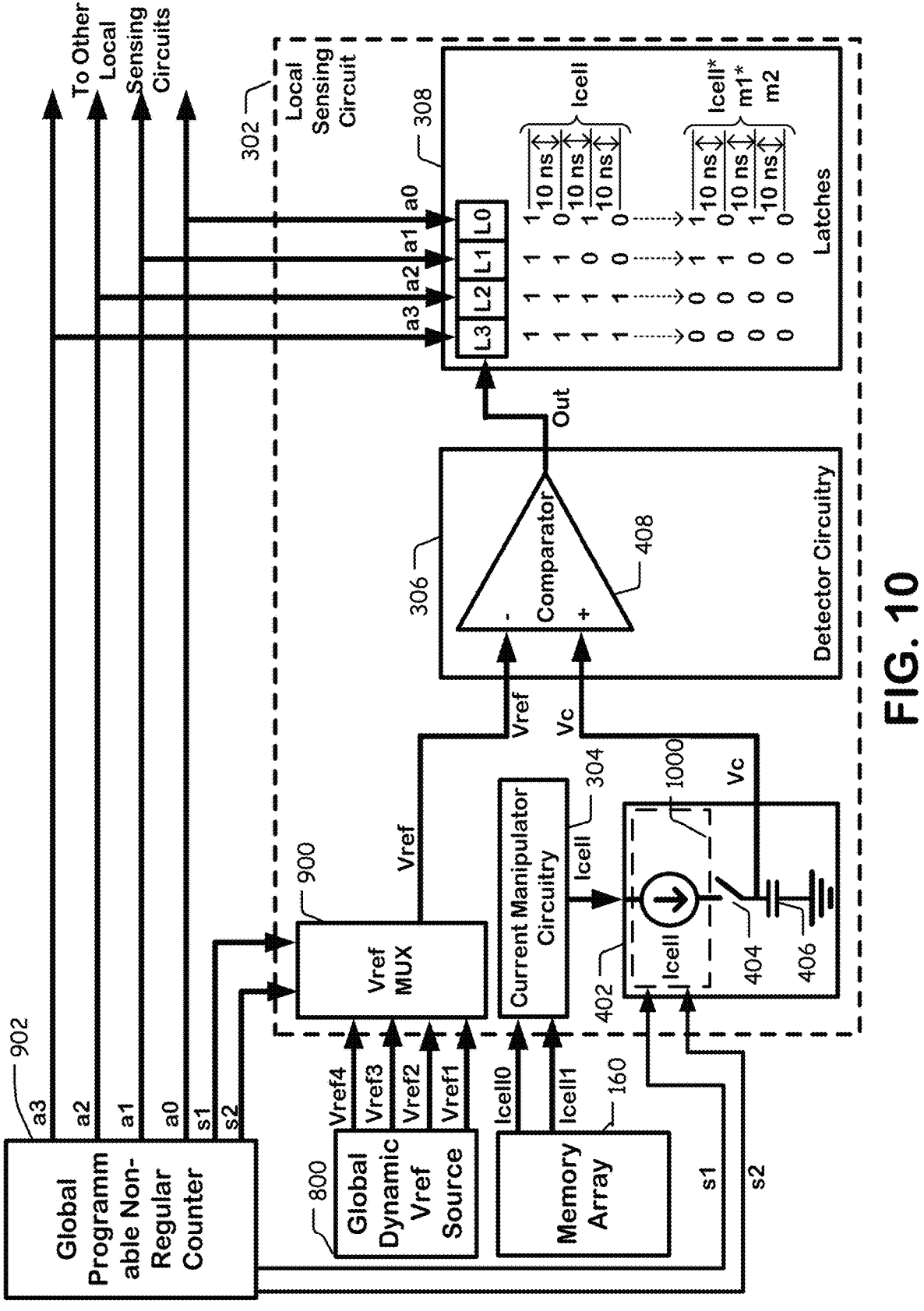
FIG. 10 is a schematic diagram of the local sensing circuit of FIG. 8, further including current mirror selector circuitry, according to embodiments of the present disclosure.

FIG. 10 is a schematic diagram of the local sensing circuit of FIG. 9, further including current mirror selector circuitry, according to embodiments of the present disclosure.

Specifically, the local sensing circuit 302 of FIG. 10 includes current mirror selector circuitry 1000. The current mirror selector circuitry 1000 is configured to select different current mirrors to apply to the current $I_{cell}$. The different current mirrors can be selected according to the first switching signal s1 and the second switching signal s2 provided from the global programmable non-regular counter 902. As described above with reference to FIG. 9, the first switching signal s1 and the second switching signal s2 can provide a binary number representing numerical values from 0 to 3, which can be used by the current mirror selector circuitry 1000 to select various combinations of current mirrors. The number of switching signals provided from the global programmable non-regular counter 902 to the current mirror selector circuitry 1000 can be dependent upon the number of current mirrors available for selection by the current mirror selector circuitry 1000. The current mirrors can apply different multiplication (or other) factors to the current $I_{cell}$ and output a mirror current based on the current $I_{cell}$ to which the multiplication (or other) factors have been applied. The mirror current, as output from the one or more current mirrors, charge up the one or more capacitors 406.

In the example illustrated in FIG. 10, the current mirror selector circuitry 1000 can receive the current $I_{cell}$ and then select various combinations of current mirrors (including no current mirror) to apply to the $I_{cell}$ for charging the one or more capacitors 406. The current mirrors can be selected in dependence upon at least one of (i) operating conditions of the in-memory compute device, (ii) a timing scheme of counter values provided by the global programmable non-regular counter 902, (iii) locations of the sensing circuits with respect to the global fixed $V_{ref}$ source 400 or the global dynamic $V_{ref}$ source 800 and (iv) predefined levels of sensed currents.

As illustrated in the latches 308 of FIG. 10, the current mirror selector circuitry 1000 can implement current mirror m1 and current mirror m2. Specifically, as illustrated in FIG. 10, the current mirror selector circuitry 1000 can simply allow $I_{cell}$ to pass through without the implementation of any additional current mirrors to change the value of $I_{cell}$ (see binary count values 1111, 1110, 1101 and 1100). The current mirror selector circuitry 1000 can also apply current mirror m1 and m2 to $I_{cell}$ by multiplying $I_{cell}$ by current mirror m1 and by current mirror m2 for certain count values (see binary count values 0011, 0010, 0001 and 0000, where $I_{cell}$ is multiplied by current mirror m1 and current mirror m2). Additionally, the current mirror selector circuitry 1000 can multiply $I_{cell}$ by current mirror m2 for certain count values, such as binary count values 0100, 0101, 0110 and 0111 (not illustrated). Further, the current mirror selector circuitry 1000 can multiply $I_{cell}$ by current mirror m1 for certain count values, such as binary count values 1000, 1001, 1010 and 1011 (not illustrated). The selection and implementation of the current mirrors m1, m2 can be used to achieve the same benefit of reducing the time interval variation as discussed with respect to FIG. 9 and the selection of the different reference voltages $V_{ref1}$, $V_{ref2}$, $V_{ref3}$, $V_{ref4}$. Additionally, as discussed with respect to FIG. 9, the global programmable non-regular counter 902 can be configured to adjust the duration between each count value (in accordance with the selection by the current mirror selector circuitry 1000). For example, as illustrated in FIG. 10, durations of 10 ns, 10 ns, 10 ns etc. (or 30 ns, 20 ns, 10 ns, etc.) can be implemented. Other timing schemes will be apparent to those skilled in the art. The number of current mirrors selected and/or implemented by the current mirror selector circuitry 1000 and the scheme for implementing the current mirrors, as discussed with reference to FIG. 10 are only examples and the number of current mirrors and the scheme for implementing the current mirrors can be different than as described here, as will be apparent to those skilled in the art.

As with FIG. 9, in some implementations in accordance with FIG. 10, the global programmable non-regular counter 902 is replaced by a global programmable regular counter, such as the global non-regular counter 600 of FIG. 6.

Figure 11:
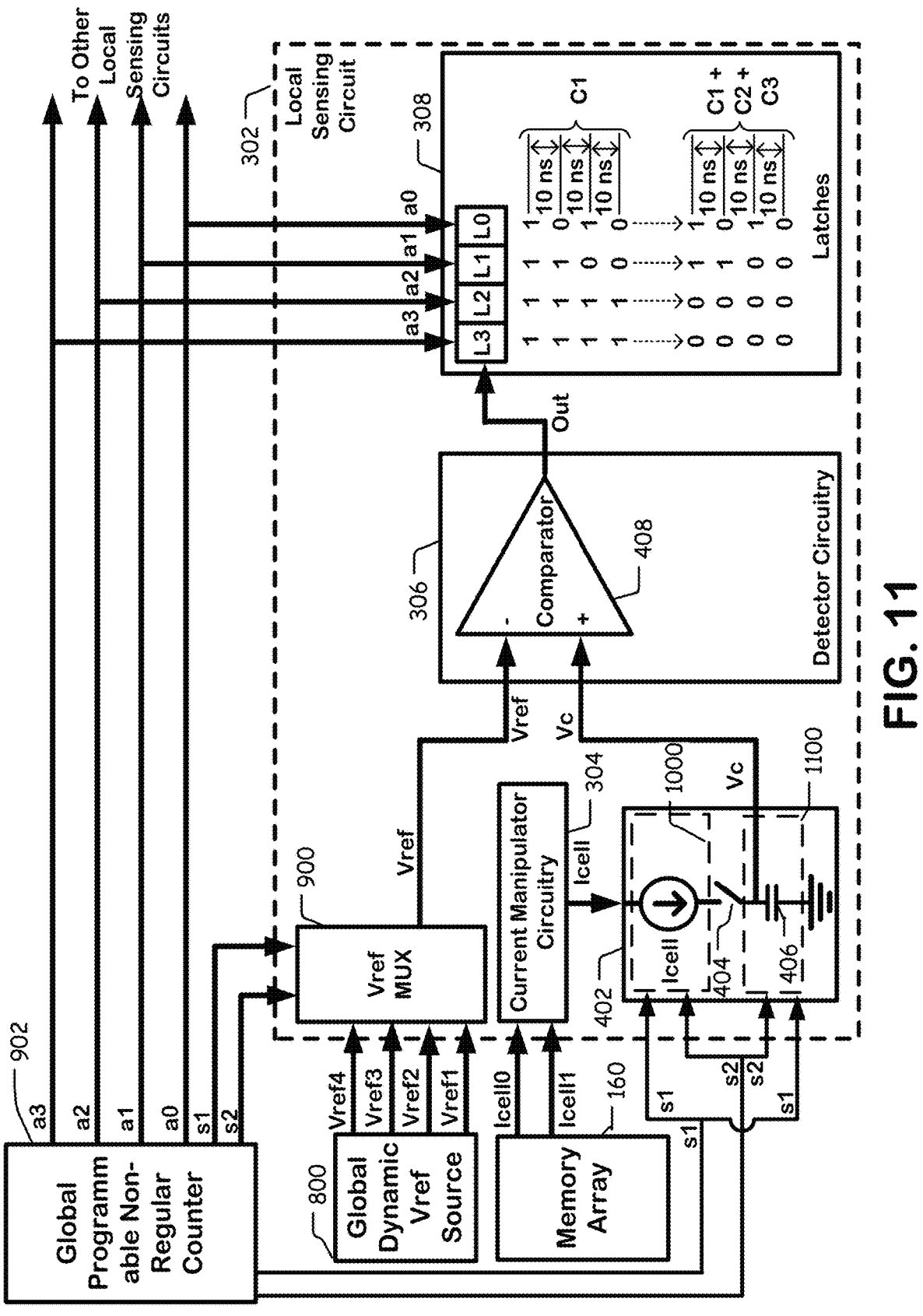
FIG. 11 is a schematic diagram of the local sensing circuit of FIG. 10, further including capacitor selector circuitry, according to embodiments of the present disclosure.

FIG. 11 is a schematic diagram of the local sensing circuit of FIG. 10, further including capacitor selector circuitry, according to embodiments of the present disclosure.

Specifically, the local sensing circuit 302 of FIG. 11 includes a capacitor selector circuitry 1100. The capacitor selector circuitry 1100 is configured to select different combinations of capacitors to implement as the one or more capacitors 406. For example, the one or more capacitors 406 can include a first capacitor C1, a second capacitor C2 and a third capacitor C3. The selected combination of capacitors can receive the current $I_{cell}$ to charge up the value of the detected voltage $V_c$. The one or more capacitors 406 can be selected according to the first switching signal s1 and the second switching signal s2 provided from the global programmable non-regular counter 902. As described above with reference to FIGS. 9 and 10, the first switching signal s1 and the second switching signal s2 can provide a binary number representing numerical values from 0 to 3, which can be used by the capacitor selector circuitry 1100 to select various combinations of the first capacitor C1, the second capacitor C2 and the third capacitor C3 of the one or more capacitors 406. The number of switching signals provided from the global programmable non-regular counter 902 to the capacitor selector circuitry 1100 can be dependent upon the number of capacitors available for selection by the capacitor selector circuitry 1100. Different implementations of various values of capacitors can change (increase and/or decrease) the charge-up time for the detected voltage $V_c$ to reach the reference voltage $V_{ref}$.

In the example illustrated in FIG. 11, the capacitor selector circuitry 1100 can receive the current $I_{cell}$ (from the selected current mirrors, if the current mirror selector circuitry 1000 is implemented or without the current mirror selector circuitry 1000, if the current mirror selector circuitry 1000 is not implemented) and then select various combinations of the first capacitor C1, the second capacitor C2 and the third capacitor C3 to receive the current $I_{cell}$ for charging. In an embodiment, a particular capacitor could be selected for each current mirror, such that each current mirror provides an output to a particular capacitor, or one or more capacitors can be selected for the group of one or more current mirrors as a whole. The capacitors can be arranged in a serial configuration or a parallel configuration or any other configuration. The capacitors can be selected in dependence upon at least one of (i) operating conditions of the in-memory compute device, (ii) a timing scheme of counter values provided by the global programmable non-regular counter 902 (*iii*) locations of the sensing circuits with respect to the global fixed $V_{ref}$ source 400 or the global dynamic $V_{ref}$ source 800 and (iv) predefined levels of sensed currents.

As illustrated in the latches 308 of FIG. 11, the capacitor selector circuitry 1100 can implement the first capacitor C1, the second capacitor C2 and/or the third capacitor C3. Specifically, as illustrated in FIG. 11, the capacitor selector circuitry 1100 can select (only) the first capacitor C1 to receive $I_{cell}$ (see binary count values 1111, 1110, 1101 and 1100). The capacitor selector circuitry 1100 can also implement a combination of (only) the first capacitor C1, the second capacitor C2 and the third capacitor C3 for certain count values (see binary count values 0011, 0010, 0001 and 0000, where $I_{cell}$ is used to charge the first capacitor C1, the second capacitor C2 and the third capacitor C3 to provide the detected voltage $V_c$). Additionally, the capacitor selector circuitry 1100 can implement (only) the first capacitor C1 and the second capacitor C2 for certain count values, such as binary count values 0100, 0101, 0110 and 0111, where $I_{cell}$ is used to charge the first capacitor C1 and the second capacitor C2 to provide the detected voltage $V_c$ (not illustrated). Further, the capacitor selector circuitry 1100 can implement (only) the second capacitor C2 for certain count values, such as binary count values 1000, 1001, 1010 and 1011, where $I_{cell}$ is used to charge the second capacitor C2 to provide the detected voltage $V_c$ (not illustrated).

The capacitor selector circuitry 1100 can implement any number of capacitors having any values. E.g., the capacitor selector circuitry 1100 can implement four capacitors, C1, C2 and C3 each having a value of 10 fF and C4 having a value of 20 fF. Collectively, the four capacitors provide for a total capacitance that is configurable in 10 fF steps from 10 fF to 50 fF (10 fF, 20 fF, 30 fF, 40 fF and 50 fF).

The selection and implementation of the capacitor selector circuitry 1100 can be used to achieve the same benefit of reducing the time interval variation as discussed above with respect to FIG. 10 and the selection of the current mirrors m1, m2 and as discussed above with respect to FIG. 9 and the selection of the different reference voltages $V_{ref1}$, $V_{ref2}$, $V_{ref3}$, $V_{ref4}$. Additionally, as discussed with respect to FIGS. 9 and 10, the global programmable non-regular counter 902 can be configured to adjust the duration between each count value (in accordance with the selection by the capacitor selector circuitry 1100). For example, as illustrated in FIG. 11, durations of 10 ns, 10 ns, 10 ns, etc. (or 30 ns, 20 ns, 10 ns, etc.) can be implemented. Other timing schemes will be apparent to those skilled in the art. The number of capacitors selected and/or implemented by the capacitor selector circuitry 1100 and the scheme for implementing the capacitors, as discussed with reference to FIG. 11 are only examples and the number of capacitors and the scheme for implementing the capacitors can be different than as described here, as will be apparent to those skilled in the art.

The technology disclosed can implement any combination of the reference voltage $V_{ref}$ multiplexer 900 as discussed above with reference to FIG. 9, the current mirror selector circuitry 1000 as discussed above with reference to FIG. 10 and the capacitor selector circuitry 1100 as discussed above with reference to FIG. 11.

As with FIG. 9 and FIG. 10, in some implementations in accordance with FIG. 11, the global programmable non-regular counter 902 is replaced by a global programmable regular counter, such as the global non-regular counter 600 of FIG. 6.

Figures 12A, 12B:
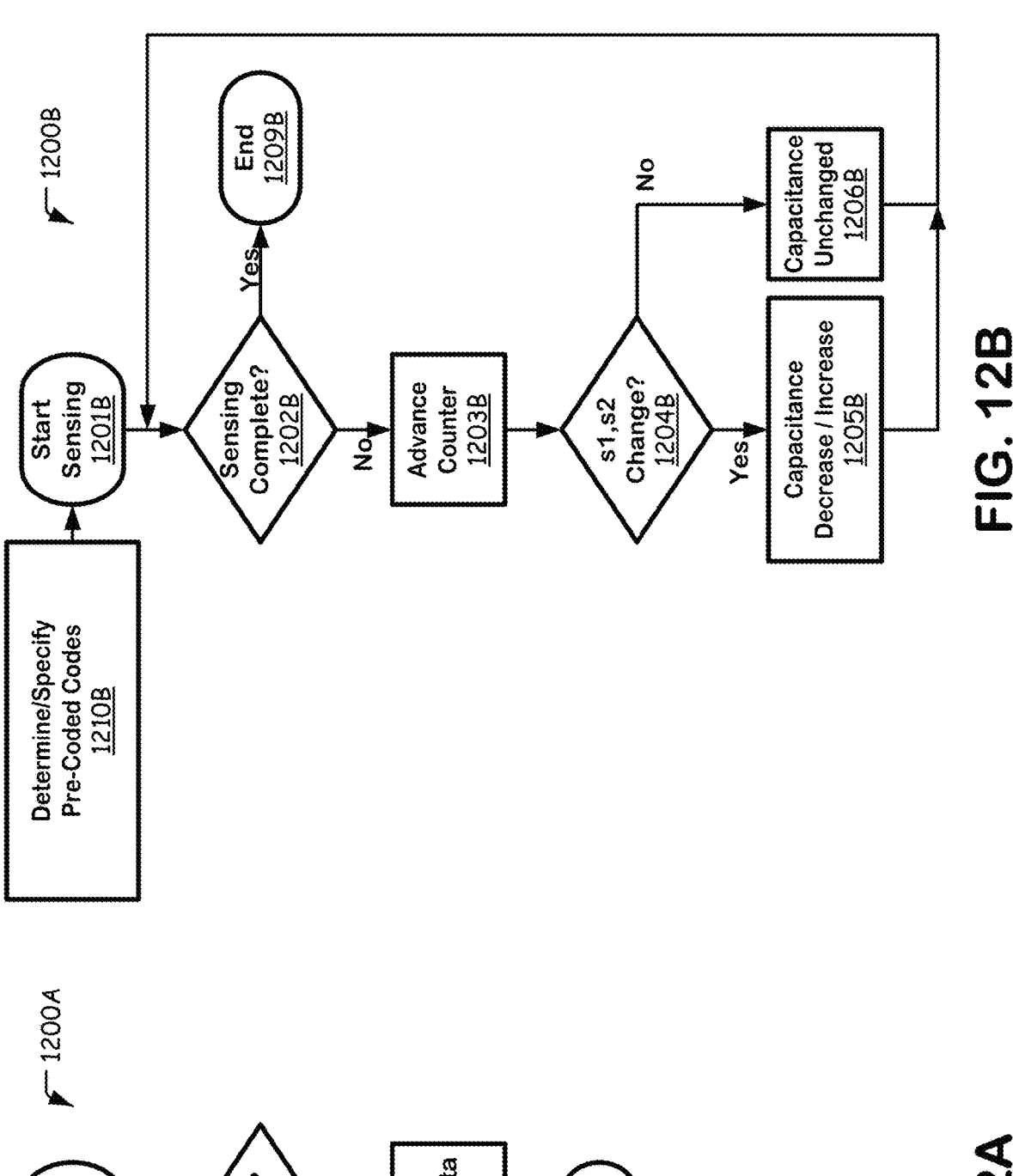
FIG. 12A is a flow diagram that illustrates operations of counter data latches.
FIG. 12B is a flow diagram that illustrates operations of capacitor selector circuitry.

FIG. 12A is a flow diagram 1200A that illustrates operations of the latches 308 of FIG. 11.

Specifically, FIG. 12A illustrates operations of the latches 308 of FIG. 11 in an operating context. Sensing of one or more currents by one or more instances of the local sensing circuit 302 begins (Start Sensing 1201A). Then a determination is made, by the detector circuitry 306, as to whether sensing is complete (Sensing Complete? 1202A). If the sensing is complete, then the count value from the global programmable non-regular counter 902 is latched in the latches 308 (Latch Counter Data 1203A) and operation is complete (End 1209A). If the sensing is not complete, then the flow loops back to determine again if sensing is complete. Thus, the operations of flow diagram 1200A represent an asynchronous latching of counter data in dependence on completion of sensing.

FIG. 12B is a flow diagram 1200B that illustrates operations of the capacitor selector circuitry 1100 of FIG. 11.

Specifically, FIG. 12B illustrates operations of the capacitor selector circuitry 1100 of FIG. 11 in an operating context. Prior to sensing (e.g., in dependence to power on), circuitry is initialized to enable controlling s1 and s2 in dependence on a clock, e.g., a high frequency clock (Determine/Specify Pre-Coded Codes 1210B). The initializing can correspond to determining and/or specifying values for the pre-coded codes 1407 of FIG. 14.

As in FIG. 12A, sensing of one or more currents by one or more instances of the local sensing circuit 302 begins (Start Sensing 1201B). Responsive to the beginning of the sensing, the switch 404 is used to discharge the one or more capacitors 406. Then a determination is made, by the detector circuitry 306, as to whether sensing is complete (Sensing Complete? 1202B). If the sensing is not complete, then the global programmable non-regular counter 902 advances to the next count value (Advance Counter 1203B). Then a determination is made (s1,s2 Change? 1204B) as to whether to leave the total capacitance receiving the charging current unchanged or to change it. If both s1 and s2 are unchanged from their values before advancement of the global programmable non-regular counter 902, then no change is made (Capacitance Unchanged 1206B via the "No" path). Alternatively, if either s1 or s2 is changed, then a change is made (Capacitance Decrease/Increase 1205B via the "Yes" path). After the capacitance change determination (s1,s2 Change? 1204B) and the following conditional capacitance adjustment (Capacitance Decrease/Increase 1205B or Capacitance Unchanged 1206B), operation loops back to check again if sensing is complete (Sensing Complete? 1202).

The specific amount of capacitance to decrease/increase (Capacitance Decrease/Increase 1205B) can be determined based on the first switching signal s1 and the second switching signal s2 provided from the global programmable non-regular counter 902, as described with respect to FIG. 11.

As a first example, the capacitor selector circuitry 1100 implements three capacitors, C1, C2 and C3 each having a value of 10 fF. The global programmable non-regular counter 902 counts upward from zero (e.g., binary count values 0000, 0001, 0010, 0011 . . . 1100, 1101, 1110, 1111). The pre-coded codes 1407 of FIG. 14 specify that for binary count values of 0000 through 0011, s1 and s0 are both zero. In dependence on s1 and s0 both being zero, the capacitor selector circuitry 1100 selects C1, C2, and C3 in parallel (30 fF) to implement as the one or more capacitors 406. The pre-coded codes 1407 of FIG. 14 further specify that for other binary count values (including binary count values of 1100 through 1111) s1 and s0 are both one. In dependence on s1 and s0 both being one, the capacitor selector circuitry 1100 selects C1 alone to implement as the one or more capacitors 406 (10 fF). Thus, in this first example, the total capacitance of the one or more capacitors 406 is decreased from 30 fF to 10 fF, in dependence on the pre-coded codes 1407.

As a second example, the capacitor selector circuitry 1100 implements three capacitors, C1, C2 and C3 each having a value of 10 fF, as in the first example. The global programmable non-regular counter 902 counts upward from zero (e.g., binary count values 0000, 0001, 0010, 0011 . . . 1100, 1101, 1110, 1111), also as in the first example. The pre-coded codes 1407 of FIG. 14 specify that for binary count values of 0000 through 0011, s1 and s0 are both one (versus zero as in the first example). In dependence on s1 and s0 both being one, the capacitor selector circuitry 1100 selects C1 alone to implement as the one or more capacitors 406 (10 fF). The pre-coded codes 1407 of FIG. 14 further specify that for other binary count values (including binary count values of 1100 through 1111) s1 and s0 are both zero (versus one as in the first example). In dependence on s1 and s0 both being zero, the capacitor selector circuitry 1100 selects C1, C2, and C3 in parallel (30 fF) to implement as the one or more capacitors 406. Thus, in this second example, the total capacitance of the one or more capacitors 406 is increased from 10 fF to 30 fF, in dependence on the pre-coded codes 1407.

In some implementations, 1201A corresponds to or is identical to 1201B. In some implementations, 1202A corresponds to or is identical to 1202B.

Figure 13:
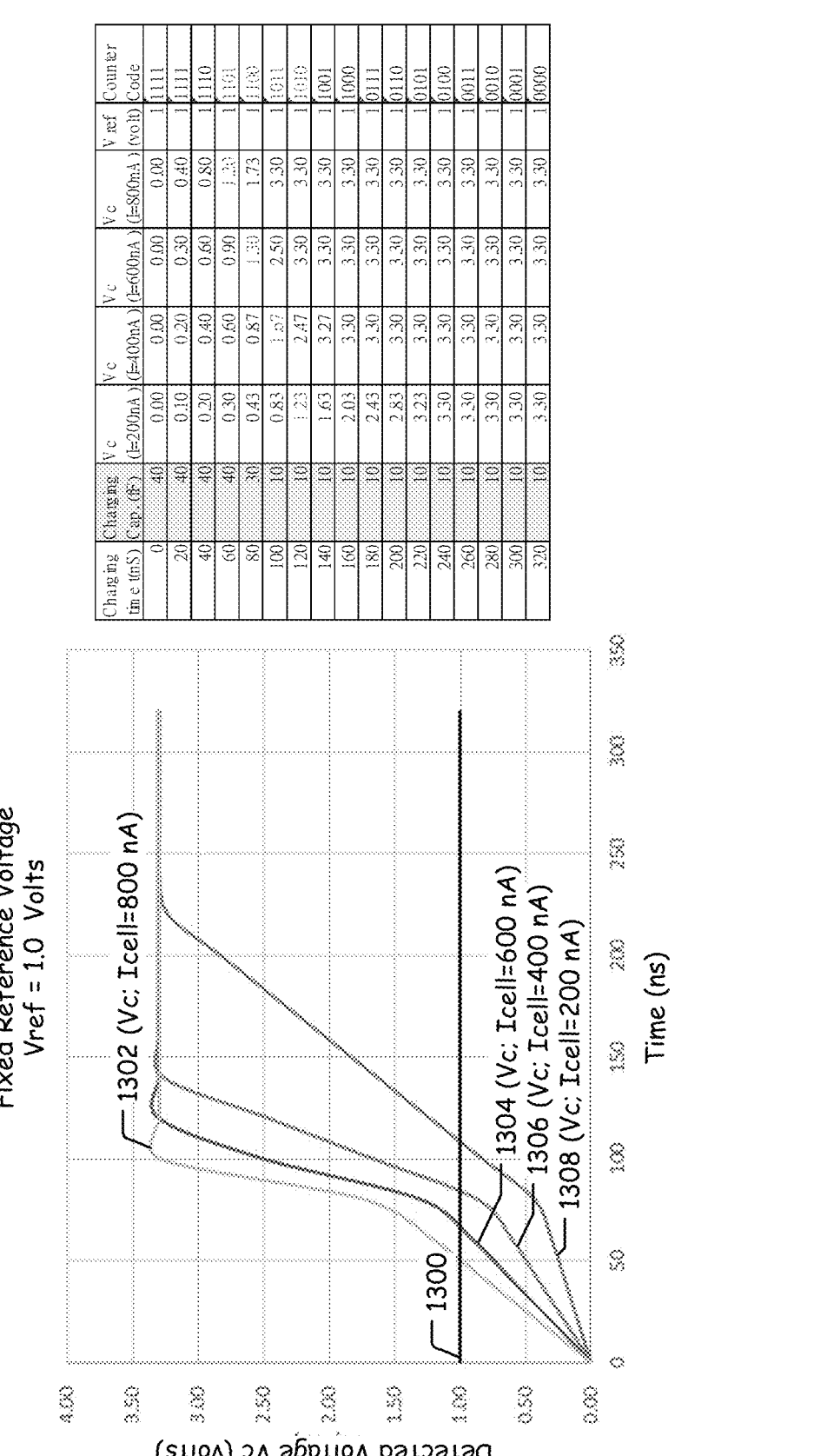
FIG. 13 illustrates aspects of dynamically adjusting total capacitance that is being charged, the illustration including a graph and a table, where the graph identifies a time it takes for a detected voltage $V_c$ to reach a fixed threshold voltage $V_{ref}$ at different current $I_{cell}$ values when implementing the local sensing circuit of FIG. 11 that operates according to the capacitor selector circuitry 1100, according to embodiments of the present disclosure.

FIG. 13 illustrates aspects of dynamically adjusting total capacitance that is being charged, the illustration including a graph and a table, where the graph identifies a time it takes for a detected voltage $V_c$ to reach a fixed threshold voltage $V_{ref}$ at different current $I_{cell}$ values when implementing the local sensing circuit of FIG. 11 that operates according to the capacitor selector circuitry 1100, according to embodiments of the present disclosure.

Specifically, the graph of FIG. 13 illustrates a graph of time in nanoseconds (ns) vs. detected voltage $V_c$ (volts). The storage of the global counter output data 301 is triggered as a result of the detected voltage $V_c$ reaching or exceeding a value of the reference voltage $V_{ref}$. In this example, the value of the reference voltage $V_{ref}$ is fixed, as it remains unchanged over time. Line 1300 in the graph of FIG. 13 represents the value of the fixed reference voltage $V_{ref}$. Line 1302 is a voltage vs. time representation of the detected voltage $V_c$ when current $I_{cell}$ is 800 nanoamps (nA). As illustrated, line 1302 crosses line 1300 at about time 50 ns. Line 1304 is a voltage vs. time representation of the detected voltage $V_c$ when current $I_{cell}$ is 600 nanoamps (nA). As illustrated, line 1304 crosses line 1300 at about 70 ns. Line 1306 is a voltage vs. time representation of the detected voltage $V_c$ when current $I_{cell}$ is 400 nanoamps (nA). As illustrated, line 1306 crosses line 1300 at about 80 ns. Line 1308 is a voltage vs. time representation of the detected voltage $V_c$ when current $I_{cell}$ is 200 nanoamps (nA). As illustrated, line 1308 crosses line 1300 at about 110 ns.

Therefore, as represented by the graph of FIG. 13, dynamically adjusting total capacitance of the charging capacitor can allow for a more consistent interval of the detected voltage $V_c$ reaching the fixed reference voltage $V_{ref}$ for different values of the current $I_{cell}$. In this illustration, the interval is about 20 ns. As illustrated, it takes longer for the detected voltage $V_c$ to reach the reference voltage $V_{ref}$ when the current $I_{cell}$ is lower (e.g., 200 nA).

The table in FIG. 13 illustrates (i) the various charging times, t, in ns, (ii) the values of the total capacitance of the charging capacitor, (iii) the values of the detected voltage $V_c$ at different current values of $I_{cell}$ (200 nA, 400 nA, 600 nA and 800 nA) at the corresponding times in ns, (iv) the fixed reference voltage $V_{ref}$ and (v) the value of the counter code.

As illustrated: (i) at 60 ns, the detected voltage $V_c$ of 1.20 volts (for a current $I_{cell}$ value of 800 nA) has just exceeded the value of 1 volt of the fixed reference voltage $V_{ref}$ resulting in a counter code value of 1101, (ii) at 80 ns, the detected voltage $V_c$ of 1.30 volts (for a current $I_{cell}$ value of 600 nA) has just exceeded the value of 1 volt of the fixed reference voltage $V_{ref}$ resulting in a counter code value of 1100, (iii) at 100 ns, the detected voltage $V_c$ of 1.67 volts (for a current $I_{cell}$ value of 400 nA) has just exceeded the value of 1 volt of the fixed reference voltage $V_{ref}$ resulting in a counter code value of 1101, and (iv) at 120 ns, the detected voltage $V_c$ of 1.23 volts (for a current $I_{cell}$ value of 200 nA) has just exceeded the value of 1 volt of the fixed reference voltage $V_{ref}$ resulting in a counter code value of 1100. Accordingly, the intervals of the detected voltage $V_c$ at different $I_{cell}$ current values can be kept the same by using a dynamically adjusted total capacitance of the charging capacitor. This consistency between the intervals (e.g., the same timing resolution between neighboring current levels) provides a benefit in that sensing windows (of time) are even for all neighbor current levels and optimized.

Figure 14:
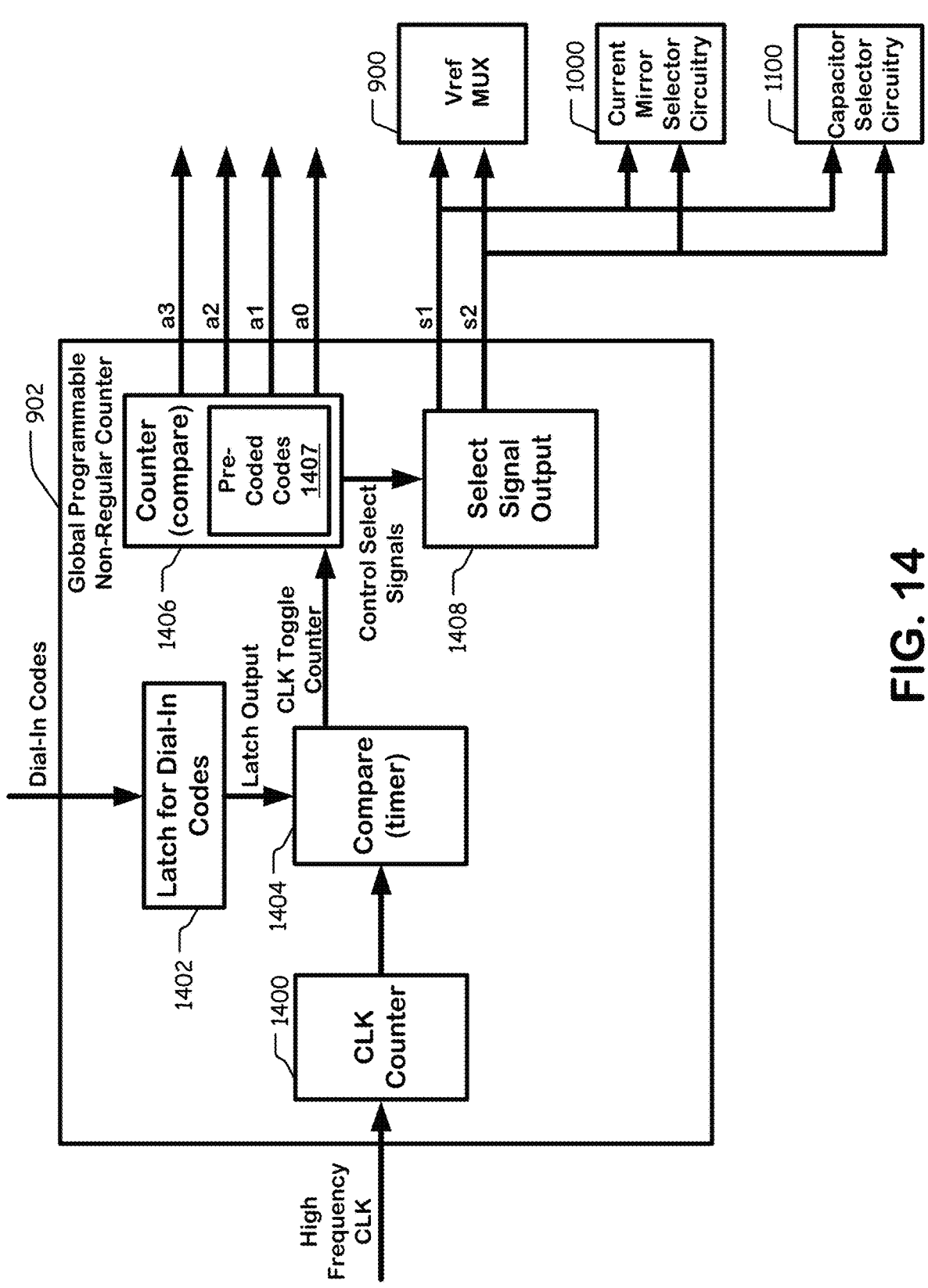
FIG. 14 is a schematic diagram of a global programmable non-regular counter, a reference voltage $V_{ref}$ multiplexer, current mirror selector circuitry and capacitor selector circuitry, according to embodiments of the present disclosure.

FIG. 14 is a schematic diagram of a global programmable non-regular counter, a reference voltage $V_{ref}$ multiplexer, current mirror selector circuitry and capacitor selector circuitry, according to embodiments of the present disclosure.

Specifically, FIG. 14 illustrates the global programmable non-regular counter 902 that includes a CLK counter 1400 (e.g., a clock circuit) that receives a high frequency CLK (e.g., a system clock signal), a latch (or other storage) for dial-in codes 1402 that receives dial-in codes, a compare (timer) 1404 that receives an output from the CLK counter 1400 and a latch out from the latch for dial-in codes 1402, a counter (compare) 1406 that receives a CLK toggle counter from the compare (timer) 1404 and outputs bits a0, a1, a2 and a3 (e.g., dynamically times and continually changing count value), and a select signal output 1408 (e.g. a select signal output circuit) that receives control select signals from the counter (compare) 1406 (e.g., a non-regular counter circuit) and outputs the first switching signal s1 and the second switching signal s2 to the reference voltage $V_{ref}$ multiplexer 900, the current mirror selector circuitry 1000 and/or the capacitor selector circuitry 1100.

The compare (timer) 1404 receives count values from the CLK counter 1400 and compares the received count values to the latch output from the latch for dial-in codes 1402 in order to generate a toggle signal to trigger the counter (compare) 1406. Accordingly, based on the comparison, the compare (timer) 1404 outputs the CLK toggle counter that instructs the counter (compare) 1406 to count. The compare (timer) 1404 can be triggered once and toggle the CLK toggle counter signal when the CLK counter 1400 outputs hit (match) one of the dial-in codes 1402. The triggered CLK toggle counter signal of the compare (timer) 1404 can instruct the counter (compare) 1406 to count up or to count down the output of the counter (compare) 1406 once (as the counter output code is a0,a1,a2,a3). The counter (compare) 1406 can also compare the counter code of a0,a1,a2,a3 with the pre-coded codes 1407, and when there is a hit (match) the control select signals can be toggled. As mentioned, the counter 1406 can output the control select signals according to the compared result of counter code a0,a1,a2,a3 with the pre-coded codes 1407 inside the counter (compare) 1406, so as to control the select signal output 1408 to output the first switching signal s1 and the second switching signal s2.

Referring to FIG. 14, codes (e.g., dial-in codes) can be dialed in (e.g., provided by an agent separate from the global programmable non-regular counter 902, such as an agent separate from and/or external to the integrated circuit device 100) to program the dynamic counting interval output by the counter (compare) 1406 to the various local sensing circuits and the dial-in codes can be trained and optimized based on different $I_{cell}$ conditions and on-field conditions, such as locations of various local sensing circuits, predefined levels of sensed currents and process, voltage and temperature (PVT) variations.

For example, in mass production, process parameters can be monitored, and the technology disclosed can dial in optimized codes based on the monitored process parameters of a mass production environment to track process variation and so on. When a specific environment is different from the norm or it changes, the technology disclosed can calibrate the global programmable non-regular counter 902 with optimized codes and then during use the global programmable non-regular counter 902 can "dial-in" one of the optimized codes that aligns with the monitored process parameters. For another example, during circuit operation, voltage and/or temperature conditions can be monitored, and the technology disclosed can dial in optimized codes based on the monitored voltage and/or temperature conditions to track voltage and/or temperature variations.

For a first specific example, in a slow process corner, $I_{cell}$ is lower as compared to a typical process corner. Thus, cell charges the one or more capacitors 406 to accumulate the charge more slowly than for the typical process corner, so that a longer amount of time passes (as compared to the typical process corner) before the comparator 408 detects that the detected voltage $V_c$ is more than the reference voltage $V_{ref}$. An optimized code can be dialed in so that a longer time interval is used (as compared to the typical process corner), enabling voltage accumulation for the slow process corner that is similar or identical to the typical process corner.

For a second specific example, during operation at a high temperature, $I_{cell}$ is lower as compared to operation at a typical temperature. As in the first specific example, $I_{cell}$ charges the one or more capacitors 406 to accumulate the charge more slowly than for operation at the typical temperature, so that a longer amount of time passes (as compared to operation at the typical temperature) before the comparator 408 detects that the detected voltage $V_c$ is more than the reference voltage $V_{ref}$. An optimized code can be dialed in so that a longer time interval is used (as compared to operation at the typical temperature), enabling voltage accumulation for operation at the high temperature that is similar or identical to operation at the typical temperature.

For a third specific example, in a fast process corner, $I_{cell}$ is higher as compared to a typical process corner. Thus, $I_{cell}$ charges the one or more capacitors 406 to accumulate the charge more quickly than for the typical process corner, so that a shorter amount of time passes (as compared to the typical process corner) before the comparator 408 detects that the detected voltage $V_c$ is more than the reference voltage $V_{ref}$. An optimized code can be dialed in so that a shorter time interval is used (as compared to the typical process corner), enabling voltage accumulation for the slow process corner that is similar or identical to the typical process corner. Alternatively, an optimized code can be dialed in so that the total capacitance of the one or more capacitors 406 is increased (as compared to operation at the typical process corner), enabling voltage accumulation for the fast process corner that is similar or identical to the typical process corner.

The dial-in codes can be used to program the timing scheme and conditions for outputting the first switching signal s1 and the second switching signal s2 (such as being used to specify and/or determine the pre-coded codes 1407). Specifically, the dial-in codes can be trained on-field (e.g., while in use in the field) or on-testing (e.g., during specific testing scenarios) by setting different $I_{cell}$ values and/or reference voltage $V_{ref}$ values to learn and adopt optimized codes for the time interval of the global programmable non-regular counter 902. The training of the $I_{cell}$ can be forced externally using a testing pin or according to an internal current source. Further, training of the $I_{cell}$ can use a reference cell current to track the cell variation of PVT variations/conditions for dynamic feedback of implementing different schemes for the counter interval and the reference voltage $V_{ref}$ multiplexer 900, the current mirror selector circuitry 1000 and/or the capacitor selector circuitry 1100. The use of the CLK counter 1400, the latch for dial-in codes 1402, the compare (timer) 1404, the latch output, the CLK toggle counter, the counter (compare) 1406, the control signals and the select signal output 1408 are merely examples and other implementations can be used to provide outputs a0-a3, s1 and s2 based in programmed codes, a clock signal and changing conditions of the in-memory compute device. The dial-in codes can be referred to as configuration data for configuring the operation of the global programmable non-regular counter 902.

The technology disclosed herein is not just limited to in-memory compute devices, but can be used for sensing in any type of memory cells in which different cell currents can represent different data values. Moreover, the technology disclosed herein is not just limited to sensing currents in memory devices and can be implemented in any device that senses current. In view of these additional configurations, the detector circuitry 306 can be any type of detector that can detect current and/or voltage. For example, the detector circuitry 306 can detect cell current from a memory cell, mirrored current and/or current from a charged-up voltage in a capacitor. The technology disclosed, such as the sensing circuits, can be implemented in a system process control block (PCB) and do not necessarily need to be implemented inside a memory chip or an in-memory compute device.

The global programmable non-regular counter 902, as well as any other counter described herein does not necessarily need to be a binary counter, it can also be circuitry that outputs any output signal in a dynamic time interval, such that the output signal can be used to (i) latch data according to different and varying time intervals, so as to perform the same or similar function as a non-regular counter and/or (ii) control any of the reference voltage $V_{ref}$ multiplexer 900, the current mirror selector circuitry 1000 and/or the capacitor selector circuitry 1100, so as to perform the same or similar function as a programmable non-regular counter.

Other implementations of the method described in this section can include a non-transitory computer readable storage medium storing instructions executable by a processor to perform any of the methods described above. Yet another implementation of the method described in this section can include a system including memory and one or more processors operable to execute instructions, stored in the memory, to perform any of the methods described above.

Any data structures and code described or referenced above are stored according to many implementations on a computer-readable storage medium, which may be any device or medium that can store code and/or data for use by a computer system. This includes, but is not limited to, volatile memory, non-volatile memory, application-specific integrated circuits (ASICs), field-programmable gate arrays (FPGAs), magnetic and optical storage devices such as disk drives, magnetic tape, CDs (compact discs), DVDs (digital versatile discs or digital video discs), or other media capable of storing computer-readable media now known or later developed.

A number of illustrations described herein reflect logic executed by a memory controller or by a memory device. The logic can be implemented using processors programmed using computer programs stored in memory accessible to the computer systems and executable by the processors, by dedicated logic hardware, including field programmable integrated circuits, and by combinations of dedicated logic hardware and computer programs. With all flowcharts herein, it will be appreciated that many of the steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A circuit, comprising:
a plurality of bit lines;
a global counter configured to provide a count value;
a global voltage reference source;
a plurality of capacitors;
capacitor selector circuitry configured to select, in dependence on the count value, one or more capacitors from the plurality of capacitors, the selected one or more capacitors configured (i) to receive a charging current in dependence on a bit line current of a selected bit line of the plurality of bit lines, (ii) to store a charge in dependence on the charging current and (iii) to produce a detected voltage ($V_c$) resulting from the stored charge, and wherein the selection of the one or more capacitors is further in dependence on pre-coded codes receivable from an agent separate from the circuit, the pre-coded codes enabling specifying respective first and second sets of the plurality of capacitors as respective one or more capacitors having respective first and second capacitance values, the pre-coded codes further enabling specifying selection of the first set of the plurality of capacitors to be performed at an earlier time than selection of the second set of the plurality of capacitors, and the second capacitance value is more than the first capacitance value;
a comparator configured to produce a comparator output in dependence on (i) a voltage provided by the global voltage reference source and (ii) the detected voltage ($V_c$); and
a storage element configured (i) to store the count value in dependence on the comparator output and (ii) to produce a stored counter output in dependence on the stored count value.

2. The circuit of claim 1, wherein the circuit is comprised in a first integrated circuit and the agent is comprised in a second integrated circuit.

3. The circuit of claim 2, wherein one or more of voltage conditions and temperature conditions are monitored to determine values of the pre-coded codes.

4. The circuit of claim 1, wherein:
the selected bit line is a first selected bit line;
the charging current is in dependence on a second selected bit line of the plurality of bit lines; and
the circuit further comprises current manipulator circuitry configured to provide the charging current in dependence on the first and the second selected bit lines as a difference between the current of the first selected bit line and a current of the second selected bit line.

5. The circuit of claim 4, further comprising a memory array comprising the plurality of bit lines.

6. The circuit of claim 5, wherein a local sensing circuit comprises the plurality of capacitors, the capacitor selector circuitry, the comparator, and the storage element, and wherein the circuit further comprises a plurality of instances of the local sensing circuit, each of the local sensing circuits configured to receive (i) the count value provided by the global counter and (ii) the voltage provided by the global voltage reference source.

7. The circuit of claim 1, wherein the global counter comprises a global programmable non-regular counter configured:
to count according to a sequence comprising a sequential series of values; and
to receive programmable information specifying one or more durations of the values.

8. The circuit of claim 1, wherein:
the voltage provided by the global voltage reference source is one of a plurality of global voltage references;
the comparator is further configured to produce the comparator output in dependence on a selected one of the plurality of global voltage references; and
the circuit further comprises a voltage reference multiplexer configured to provide, in dependence on the count value, the selected one of the plurality of global voltage references.

9. The circuit of claim 1, further comprising:
a plurality of current mirrors; and
current mirror selector circuitry configured to receive the current of the selected bit line and to select, in dependence on the count value, one or more current mirrors from the plurality of current mirrors to collectively provide the charging current.

10. The circuit of claim 1, wherein the comparator output is generated as a result of the detected voltage ($V_c$) reaching, exceeding or falling below the voltage provided by the global voltage reference source.

11. The circuit of claim 1, wherein the global counter is one of a regular counter and a non-regular counter.

12. A circuit, comprising:
a memory array comprising a plurality of bit lines;
a global voltage reference source;
a plurality of capacitors; and
capacitor selector circuitry configured to select, in dependence on a count value, one or more capacitors from the plurality of capacitors, the selected one or more capacitors configured (i) to receive a charging current in dependence on a difference between two bit line currents of a selected two bit lines of the plurality of bit lines, (ii) to store a charge in dependence on the charging current and (iii) to produce a detected voltage ($V_c$) resulting from the stored charge, and wherein the selection of the one or more capacitors is further in dependence on pre-coded codes receivable from an agent separate from the circuit, the pre-coded codes enabling specifying respective first and second sets of the plurality of capacitors as respective one or more capacitors having respective first and second capacitance values, the pre-coded codes further enabling specifying selection of the first set of the plurality of capacitors to be performed at an earlier time than selection of the second set of the plurality of capacitors, and the second capacitance value is more than the first capacitance value.

13. The circuit of claim 12, wherein the capacitor selector circuitry is configured to select the one or more capacitors such that:

on a first cycle of a clock, the selected one or more capacitors have a first total capacitance; and on a second cycle of the clock, subsequent to the first cycle of the clock, the selected one or more capacitors have a second total capacitance that is greater than the first total capacitance.

14. The circuit of claim 13, wherein the circuit further comprises:

a global counter configured to provide the count value;

a comparator configured to produce a comparator output in dependence on (i) a voltage provided by the global voltage reference source and (ii) the detected voltage $(V_c)$; and a storage element configured (i) to store the count value in dependence on the comparator output and (ii) to produce a stored counter output in dependence on the stored count value.

15. The circuit of claim 14, wherein:

the voltage provided by the global voltage reference source is one of a plurality of global voltage references;

the comparator is further configured to produce the comparator output in dependence on a selected one of the plurality of global voltage references; and the circuit further comprises a voltage reference multiplexer configured to provide, in dependence on the count value, the selected one of the plurality of global voltage references.

16. The circuit of claim 14, wherein the global counter is one of a regular counter and a non-regular counter.

17. A method comprising:

selecting, in dependence on a count value, one or more capacitors from a plurality of capacitors, the selected one or more capacitors (i) receiving a charging current in dependence on a bit line current of a selected bit line of a plurality of bit lines, (ii) storing a charge in dependence on the charging current and (iii) producing a detected voltage $(V_c)$ resulting from the stored charge, and wherein the selection of the one or more capacitors is further in dependence on pre-coded codes received from an agent, the pre-coded codes specifying respective first and second sets of the plurality of capacitors as respective one or more capacitors having respective first and second capacitance values, the pre-coded codes further specifying selection of the first set of the plurality of capacitors to be performed at an earlier time than selection of the second set of the plurality of capacitors, and the second capacitance value is more than the first capacitance value;

producing a comparator output in dependence on (i) a voltage provided by a global voltage reference source and (ii) the detected voltage $(V_c)$;

storing the count value in dependence on the comparator output; and producing a stored counter output in dependence on the stored count value.

18. The method of claim 17, further comprising performing the selecting such that:

on a first cycle of a clock, the selected one or more capacitors have a first total capacitance; and on a second cycle of the clock, subsequent to the first cycle of the clock, the selected one or more capacitors have a second total capacitance that is greater than the first total capacitance.

19. The method of claim 17, further comprising providing the pre-coded codes.

20. The method of claim 17, wherein a memory array comprises the plurality of bit lines.

\* \* \* \* \*